(12) United States Patent
Thyssen

(10) Patent No.: US 10,149,051 B2
(45) Date of Patent: *Dec. 4, 2018

(54) SYSTEM AND METHOD FOR LOUDSPEAKER PROTECTION

(71) Applicant: Avago Technologies International Sales Pte. Limited

(72) Inventor: Jes Thyssen, San Juan Capistrano, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/365,375

(22) Filed: Nov. 30, 2016

(65) Prior Publication Data

US 2017/0347189 A1    Nov. 30, 2017

Related U.S. Application Data

(60) Provisional application No. 62/343,517, filed on May 31, 2016, provisional application No. 62/415,026, (Continued)

(51) Int. Cl.
*H03G 11/00* (2006.01)
*H04R 3/00* (2006.01)
(Continued)

(52) U.S. Cl.
CPC .......... *H04R 3/007* (2013.01); *G10L 21/0232* (2013.01); *H03G 3/3005* (2013.01);
(Continued)

(58) Field of Classification Search
CPC ..................................................... H03G 11/00
See application file for complete search history.

(56) References Cited

U.S. PATENT DOCUMENTS 9,065,412 B2  6/2015 Wu
9,837,971 B2  12/2017 Luo et al.
(Continued)

OTHER PUBLICATIONS

Bright, A., *Active Control of Loudspeakers: An Investigation of Practical Applications*, Ph.D. Thesis. Ørsted•DTU—Acoustic Technology, Technical University of Denmark, 2002, 203 pages.
Bright, A., "Discrete-time loudspeaker modelling," *Audio Engineering Society 114th Convention*, Amsterdam, The Netherlands, Mar. 22-25, 2003, 25 pages.
Henderson, H.V. and Searle, S.R., "On Deriving the Inverse of a Sum of Matrices," *Paper No. BU-647-M in the Biometrics Unit Series*, Jan. 1980, 21 pages.
(Continued)

*Primary Examiner* — Olisa Anwah
(74) *Attorney, Agent, or Firm* — Sterne, Kessler, Goldstein & Fox P.L.L.C.

(57) ABSTRACT

Systems, devices, and methods are described for providing loudspeaker protection. An upstream loudspeaker model estimation component receives sensed electrical characteristics of a loudspeaker and generates an impedance model from which an excursion model, and associated parameters, of the loudspeaker as well as a gain change parameter may be generated. The impedance components are fitted to features of an estimated impedance, based on the voltage and current sense data, to generate the estimated impedance model of the loudspeaker by combining the fitted impedance components. The resulting estimated impedance model is converted to an excursion model of the loudspeaker. A downstream audio signal processing component utilizes the excursion model, or parameters thereof, to limit a predicted excursion of the loudspeaker. Processed audio signals associated with the limited excursion are subject to distortion suppression prior to releasing the output audio signals for playback on the loudspeaker.

20 Claims, 7 Drawing Sheets

Related U.S. Application Data filed on Oct. 31, 2016, provisional application No. 62/423,292, filed on Nov. 17, 2016, provisional application No. 62/423,533, filed on Nov. 17, 2016.

(51) Int. Cl.

| | | |
|---|---|---|
| *G10L 21/0232* | (2013.01) | |
| *H04R 29/00* | (2006.01) | |
| *H04R 9/06* | (2006.01) | |
| *H03G 3/30* | (2006.01) | |
| *H04R 3/04* | (2006.01) | |

(52) U.S. Cl.
CPC .............. *H04R 3/04* (2013.01); *H04R 9/06* (2013.01); *H04R 29/001* (2013.01); *H04R 2499/11* (2013.01)

(56) References Cited

U.S. PATENT DOCUMENTS

| | | |
|---|---|---|
| 2010/0215193 A1 | 8/2010 | Wihardja et al. |
| 2011/0178800 A1 | 7/2011 | Watts |
| 2011/0228945 A1* | 9/2011 | Mihelich ............ H04R 3/002 381/59 |
| 2012/0281844 A1 | 11/2012 | Luo et al. |
| 2015/0003606 A1 | 1/2015 | Nemer |
| 2015/0304772 A1 | 10/2015 | Risberg et al. |
| 2015/0304775 A1 | 10/2015 | Fujita |
| 2016/0192070 A1 | 6/2016 | Bjoern-Josefsen et al. |
| 2016/0241960 A1 | 8/2016 | Cheng et al. |
| 2017/0318388 A1 | 11/2017 | Risberg et al. |
| 2017/0318390 A1 | 11/2017 | Bjork et al. |
| 2017/0345438 A1 | 11/2017 | Thyssen |
| 2017/0347188 A1 | 11/2017 | Thyssen |
| 2017/0347190 A1 | 11/2017 | Thyssen |
| 2017/0347199 A1 | 11/2017 | Mao et al. |

OTHER PUBLICATIONS

Johnson, C.R., Jr., "Adaptive IIR filtering: Current Results and Open Issues," *IEEE Transactions on Information Theory*, vol. IT-30, No. 2, Mar. 1984, pp. 237-250.

Klippel, W., "Assessment of Voice-Coil Peak Displacement Xmax," *Journal of Audio Engineering Society*, vol. 51, No. 5, May 2003, 15 pages.

Klippel, W. and Seidel, U., "Fast and Accurate Measurement of Linear Transducer Parameters," *Audio Engineering Society 110th Convention*, Amsterdam, The Netherlands, May 12-15, 2001, 8 pages.

Klippel, W., "Large Signal Performance of Tweeters, Micro Speakers, and Horn Drivers," *Audio Engineering Society 118th Convention*, May 2005, 18 Pages.

Klippel, W., "Measurement of Large-Signal Parameters of Electrodynamic Transducer", *Audio Engineering Society 107th Convention*, New York, Sep. 24-27, 1999, 22 Pages.

Klippel, W., "Nonlinear losses in electro-acoustical transducers," *Proceedings of the Acoustics 2012 Nantes Conference*, Nantes, France, Apr. 23-27, 2012, pp. 3483-3488.

Klippel, W. et al., "The power of Loudspeaker Models," Workshop at Audio Engineering Society 117th Convention, San Francisco, Oct. 28-31, 2004, 50 Pages.

Klippel, W., "Tutorial: Loudspeaker Nonlinearities—Causes, Parameters, Symptoms," *Journal of the Audio Engineering Society*, vol. 54, No. 10, Oct. 2006, pp. 907-939.

Knudsen, M.H. et al., "Determination of Loudspeaker Driver Parameters Using a System Identification Technique," *Journal of the Audio Engineering Society*, vol. 37, No. 9, Sep. 1989, pp. 700-708.

Luo, C, et al., "A Model Based Excursion Protection Algorithm for Loudspeakers," *Proceedings ICASSP*, 2012, pp. 233-236.

Shynk, J.J., "Adaptive IIR Filtering", *IEEE ASSP Magazine*, Apr. 1989, pp. 4-21.

\* cited by examiner

Generate the estimated impedance model of the loudspeaker by combining less than all of the plurality of fitted impedance components — 706

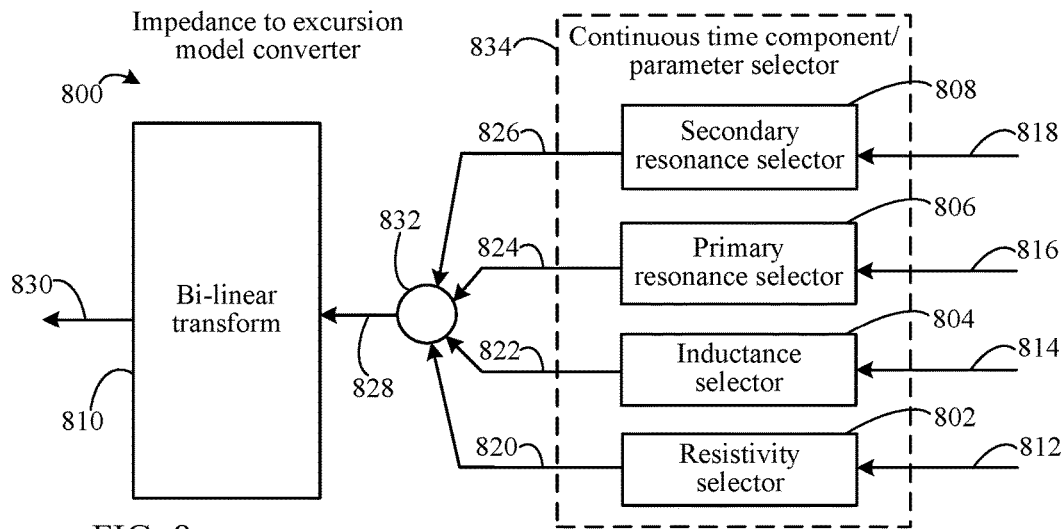

FIG. 8

Receive the fitted plurality of estimated impedance components that comprise the estimated impedance model from the impedance model fitter — 902

Convert the resulting estimated impedance model to an excursion model of the loudspeaker — 904

Transform a continuous time transfer function to a discrete time transfer function to generate the excursion model — 1002

Convert a portion the resulting estimated impedance model to an excursion model of the loudspeaker — 1102

SYSTEM AND METHOD FOR LOUDSPEAKER PROTECTION

CROSS-REFERENCE TO RELATED APPLICATIONS

The instant application claims priority to each of: U.S. Provisional Patent Application No. 62/415,026, entitled "System and Method for Loudspeaker Protection," filed on Oct. 31, 2016, U.S. Provisional Patent Application No. 62/343,517, entitled "System and Method for Loudspeaker Protection," filed on May 31, 2016, U.S. Provisional Patent Application No. 62/423,292, entitled "System and Method for Loudspeaker Protection," filed on Nov. 17, 2016, and U.S. Provisional Patent Application No. 62/423,533, entitled "System and Method for Loudspeaker Protection," filed on Nov. 17, 2016, the entirety of each of which is incorporated herein by reference.

BACKGROUND

I. Technical Field

Embodiments described herein relate to protection of loudspeakers during operation.

II. Background Art

Devices, such as personal computers and laptops, cellular and smart phones, wireless device accessories, headsets, personal digital assistants (PDAs), portable music players, handheld gaming devices, home electronics and entertainment devices, televisions, stand-alone loudspeaker units, etc., include loudspeakers, such as microspeakers, for reproduction or playback of an audio signal. Loudspeakers may suffer damage and/or failures from extended high-stress use and over-excursion scenarios. For example, extended use at high audio volume levels and/or in high temperatures can cause breakdowns by melting the adhesives used to attach the voice coils in loudspeakers. High audio volume levels can also cause diaphragms of speakers to travel (i.e., undergo an excursion) beyond their mechanical capabilities resulting in permanent damage to the suspension of the loudspeaker. Existing solutions use linear filtering to constrain the amplitude of audio signals to mediate excursions based on a speaker impedance model. This constraint processing may introduce distortion into audio signals or excessively lower the perceived loudness of the audio signal.

BRIEF SUMMARY

Methods, systems, and apparatuses are described for loudspeaker protection, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

FIG. 7B shows a flowchart for impedance model estimation by the impedance model fitter of FIG. 4, according to an example embodiment.

FIG. 8 shows a block diagram of an impedance to excursion model converter of an upstream loudspeaker model estimation component of a loudspeaker protection system, according to an example embodiment.

FIG. 9 shows a flowchart for impedance to excursion model conversion by the impedance to excursion model converter of FIG. 8, according to an example embodiment.

FIG. 10 shows a flowchart for impedance to excursion model conversion by the impedance to excursion model converter of FIG. 8, according to an example embodiment.

FIG. 11 shows a flowchart for impedance to excursion model conversion by the impedance to excursion model converter of FIG. 8, according to an example embodiment.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1A:
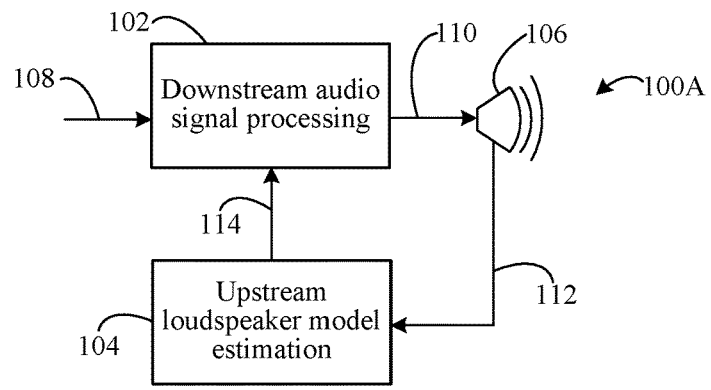
FIG. 1A shows a block diagram of a loudspeaker protection system, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the discussion, unless otherwise stated, adjectives such as "substantially," "approximately," and "about" modifying a condition or relationship characteristic of a feature or features of an embodiment of the disclosure, are understood to mean that the condition or characteristic is defined to be within tolerances that are acceptable for operation of the embodiment for an application for which it is intended.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Still further, it should be noted that the drawings/figures are not drawn to scale unless otherwise noted herein.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner. That is, the embodiments described herein are not mutually exclusive of each other and may be practiced and/or implemented alone, or in any combination.

II. Example Embodiments

The example techniques and embodiments described herein may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, stand-alone loudspeaker units, and/or the like, that include loudspeakers, such as but not limited to microspeakers. While the embodiments herein may be described with respect to microspeakers as conceptual and/or illustrative examples for descriptive consistency, other types of loudspeakers are also contemplated for implementing the disclosed techniques. It is contemplated herein that in various embodiments and with respect to the illustrated figures of this disclosure, one or more components described and/or shown may not be included and that additional components may be included.

The techniques described herein provide novel loudspeaker protection systems, methods, and devices, such as in devices with loudspeakers, e.g., microspeakers, etc. The described techniques and embodiments provide for efficient, robust loudspeaker protection using upstream loudspeaker model estimation and downstream audio signal processing. For example, a loudspeaker protection system may include an upstream loudspeaker model estimation component and a downstream audio signal processing component.

An upstream loudspeaker model estimation component of an audio protection system according to embodiments is configured to provide component-based impedance model fitting of electrical characteristics of operating loudspeakers. That is, current and voltage characteristics of an operating loudspeaker may be sensed (e.g., during playback of general audio) to generate an impedance estimation. From this estimation, different impedance components, which comprise one or more respective impedance parameters, may be individually fit into an impedance model. Furthermore, some loudspeaker enclosures result in a secondary resonance which can also be reliably fit into the impedance model. In embodiments, separate excursion model conversion (to model excursions of operating loudspeakers) is provided by upstream loudspeaker model estimation components based on the impedance model. The described upstream loudspeaker model estimation components also seamlessly incorporate temperature prediction and corresponding gain modifiers into the loudspeaker protection systems herein.

A downstream audio signal processing component of an audio protection system according to embodiments is configured to utilize the gain modifiers generated by the upstream loudspeaker model estimation component to process an audio signal, e.g., reducing gain, to lower voice coil temperature to within acceptable operational ranges. A downstream audio signal processing component is also configured to perform signal processing to constrain loudspeaker excursions (e.g., of the diaphragm, the cone, etc.). The signal processing operates to constrain or limit a diaphragm excursion of a loudspeaker by processing the corresponding audio signals such that the resulting excursion is constrained (e.g., by limiting a voltage thereof) using a non-linear constraint filter, which includes a limiter, in a manner that is based on the excursion model. Limiting the excursion of the diaphragm of the loudspeaker mitigates, or eliminates, loudspeaker damage or failure due to the loudspeaker diaphragm traveling outside its mechanical parameters. Techniques also provide for distortion suppression to suppress unwanted distortion introduced by the non-linear constraint filter on a frequency bin basis. An unwanted distortion may be one that creates an objectionable listening experience for a listener or user of the device. In embodiments, unwanted distortion may be based on one or more types of distortion meeting or exceeding a threshold. While diaphragm excursions are referred to herein, it is also contemplated that other excursions associated with loudspeakers, e.g., cone excursions, are contemplated herein, and the described techniques and embodiments are applicable thereto.

FIG. 1A shows a block diagram of a loudspeaker protection system 100A, according to an embodiment. Loudspeaker protection system 100A includes a downstream audio signal processing component 102 and an upstream loudspeaker model estimation component 104. Downstream audio signal processing component 102 and upstream loudspeaker model estimation component 104 may perform functions as described above. Upstream loudspeaker model estimation component 104 is configured to receive sensed electrical characteristics, or indicia thereof, of a loudspeaker 106 via a connector 112 when loudspeaker 106 is operating, i.e., reproducing audio sounds. Upstream loudspeaker model estimation component 104 is configured to generate an excursion model and a gain modifier for providing to downstream audio signal processing component 102 via a connector 114. Downstream audio signal processing component 102 is configured to receive an audio signal via a connector 108 and perform audio signal processing according to the excursion model and/or gain modifier, in embodiments, and is configured to perform distortion suppression of audio signals, in embodiments, for audio signal outputs provided for playback by loudspeaker 106 via a connector 110.

In embodiments, upstream loudspeaker model estimation component 104 does not perform processing of audio signals, while downstream audio signal processing component 102 performs all audio signal processing. Additionally, upstream loudspeaker model estimation component 104 is configured to update and provide the excursion model and the gain modifier to downstream audio signal processing component 102 asynchronously with respect to the operation of downstream audio signal processing component 102, e.g. the downstream processing component 102 may be block based, for instance, with a 10 ms frame, i.e., a frame-rate of 1 frame per 10 ms, while the upstream component 104 provides parameters to the downstream processing component less frequently or at a slower rate, but typically on a downstream frame boundary. Upstream loudspeaker model estimation component 104 and downstream audio signal processing component 102 may be implemented in hardware, firmware, software, or any combination thereof. In one embodiment, downstream audio signal processing component 102 is implemented as electrical hardware and upstream loudspeaker model estimation component 104 is implemented as a combination of hardware, firmware, and software.

As noted above, loudspeaker protection system 100A may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, standalone loudspeaker units, and/or the like, that include loudspeakers. It should be understood that the connections described above may comprise one or more connections that are related to or separate from each other. Further embodiments and details relating to loudspeaker protection systems, downstream audio signal processing component 102, and upstream loudspeaker model estimation component 104 are described elsewhere herein.

Figure 1B:
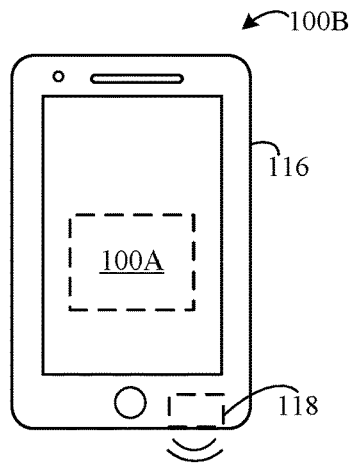
FIG. 1B shows a device that includes the loudspeaker protection system of FIG. 1A, according to an example embodiment.

FIG. 1B shows a device 100B that includes loudspeaker protection system 100A of FIG. 1A, according to an embodiment. While device 100B is shown as a smartphone, other types of devices described herein are also contemplated according to embodiments. Device 100B includes a base structure 116. Base structure 116 includes buttons and/or other types of user interfaces, cameras, and microphones, as well as processing and communication circuitry, memory, and/or the like, commonly found in smartphones as would be understood by one of skill in the relevant art(s) having the benefit of this disclosure. Base structure 116 may also include an enclosure 118 having an aperture through which sound of a loudspeaker (e.g., loudspeaker 106 of FIG. 1A) is emitted. Enclosure 118 may encompass or substantially encompass the loudspeaker, and may result in a secondary resonance during operation of the loudspeaker.

Referring back to FIG. 1A, loudspeaker 106 may be any type of loudspeaker, such as a microspeaker (a thin electrodynamic loudspeaker), and more than one loudspeaker may be included in a device, according to embodiments. In such embodiments, the embodiments and techniques described herein may be applied to one or more loudspeakers of a device.

Figure 1C:
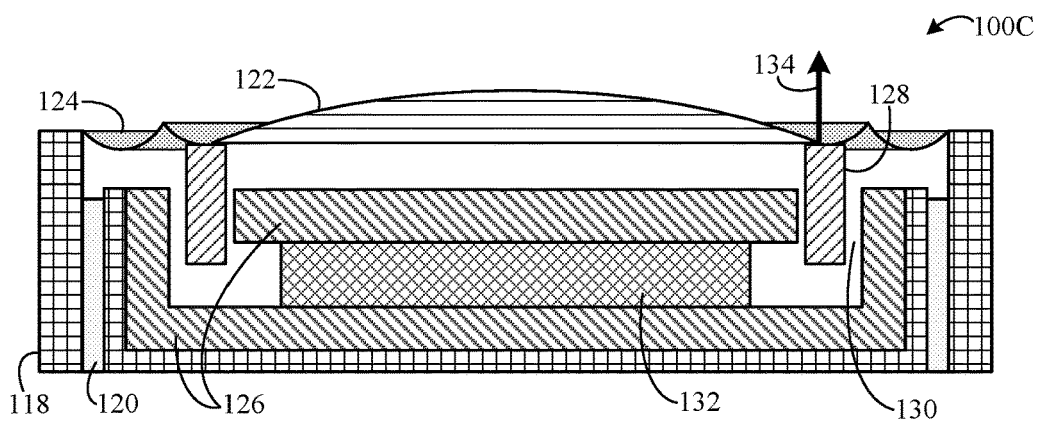
FIG. 1C shows a diagram of a cross-section of a microspeaker, according to an example embodiment.

Turning now to FIG. 1C, a diagram of a cross-section of a microspeaker 100C is shown, according to an embodiment. Microspeaker 100C may be a further embodiment of loudspeaker 106 of FIG. 1A, and may be included in enclosure 118 of FIG. 1B in embodiments. Microspeaker 100C includes a frame 118 having one or more ventilation passages 120. Frame 118 supports magnetic circuits 126 and a suspension 124, and a magnet 132 is included between magnetic circuits 126, e.g., as shown in FIG. 1C. A voice coil 128 is attached via adhesive to a diaphragm 122. A magnetic field is applied in a gap 130 between voice coil 128 and magnetic circuits 126 resulting in voice coil 128 exerting a force $f_x$, on diaphragm 122 causing diaphragm 122 to travel a distance $x_d$ (i.e., an excursion or displacement). The force $f_x$ and the distance $x_d$ are denoted as a vector 134. The magnitude of $f_x$ and length of $x_d$ correlate to the magnetic field and its associated voltage of an audio signal being played back by microspeaker 100C. If excessive force is applied as $f_x$, or applied for an extended period of time, diaphragm 122 of microspeaker 100C may travel beyond its mechanical limits (i.e., an excursion with a distance $x_d$) resulting in damage or failure of microspeaker 100C. Furthermore, adhesives used to attach voice coil 128 to diaphragm 122 and/or suspension 124 may slowly break down or melt with rising temperatures of voice coil 128. Accordingly, the techniques and embodiments described herein provide for improvements in the protection of loudspeakers as described above, including but not limited to microspeakers.

For instance, methods, systems, devices, and apparatuses are provided for improved loudspeaker protection. A loudspeaker protection system in accordance with an example aspect is described. The loudspeaker protection system includes an upstream loudspeaker model estimation component. The upstream loudspeaker model estimation component includes an impedance model fitter and an excursion model converter. The impedance model fitter is configured to receive voltage sense data and current sense data of a loudspeaker, estimate a plurality of impedance parameters associated with impedance components of the loudspeaker based on the voltage sense data and the current sense data, and fit each of the plurality of impedance components to an estimated impedance based on the voltage sense data and the current sense data to generate an estimated impedance model of the loudspeaker by combining the plurality of fitted impedance components. The excursion model converter is configured to receive the fitted plurality of estimated impedance components that comprise the estimated impedance model from the impedance model fitter, and convert the resulting estimated impedance model to an excursion model of the loudspeaker.

A method in a loudspeaker protection system in accordance with another example aspect is described. The method includes performing, by an impedance model fitter, receiving voltage sense data and current sense data of a loudspeaker, estimating a plurality of impedance parameters associated with impedance components of the loudspeaker based on the voltage sense data and the current sense data, and fitting each of the plurality of impedance components to an estimated impedance based on the voltage sense data and the current sense data to generate an estimated impedance model of the loudspeaker by combining the plurality of fitted impedance components. The method further includes performing, by an excursion model converter, receiving the fitted plurality of estimated impedance components that comprise the estimated impedance model from the impedance model fitter, and converting the resulting estimated impedance model to an excursion model of the loudspeaker.

A computer readable storage device in accordance with yet another example aspect is also described. The computer readable storage device comprises a storage medium encoded with program instructions that, when executed by a computing device, cause the computing device to perform a method for loudspeaker protection based on processing of an audio signal. The program instructions include impedance model fitting program instructions for receiving voltage sense data and current sense data of a loudspeaker, estimating a plurality of impedance parameters associated with impedance components of the loudspeaker based on the voltage sense data and the current sense data, and fitting each of the plurality of impedance components to an estimated impedance based on the voltage sense data and the current sense data to generate an estimated impedance model of the loudspeaker by combining the plurality of fitted impedance components. The program instructions also include excursion model converter instructions for receiving the fitted plurality of estimated impedance components that comprise the estimated impedance model from the impedance model fitter, and converting the resulting estimated impedance model to an excursion model of the loudspeaker.

Various example embodiments are described in the following subsections. In particular, example upstream loudspeaker model estimation embodiments are described. This description is followed by downstream audio signal processing embodiments. Next, further example embodiments and advantages are described, and subsequently an example computing device implementation is described. Finally, some concluding remarks are provided. It is noted that the division of the following description generally into subsections is provided for ease of illustration, and it is to be understood that any type of embodiment may be described in any subsection.

III. Example Upstream Loudspeaker Model Estimation Embodiments

As noted above, systems for protection of loudspeakers, such as microspeakers, along with their components such as upstream loudspeaker model estimation components, may be configured in various ways to provide loudspeaker protection.

In embodiments, by way of illustrative example and not limitation, an upstream loudspeaker model estimation component comprises one or more subcomponents configured to fit parameters of an impedance model of a loudspeaker during operation, generate an excursion model, predict a temperature of a voice coil of the loudspeaker, and generate a gain change parameter. These functions of the upstream loudspeaker model estimation component may be based, at least in part, on sensed electrical characteristics, or indicia thereof, of the loudspeaker during its operation.

Figure 2:
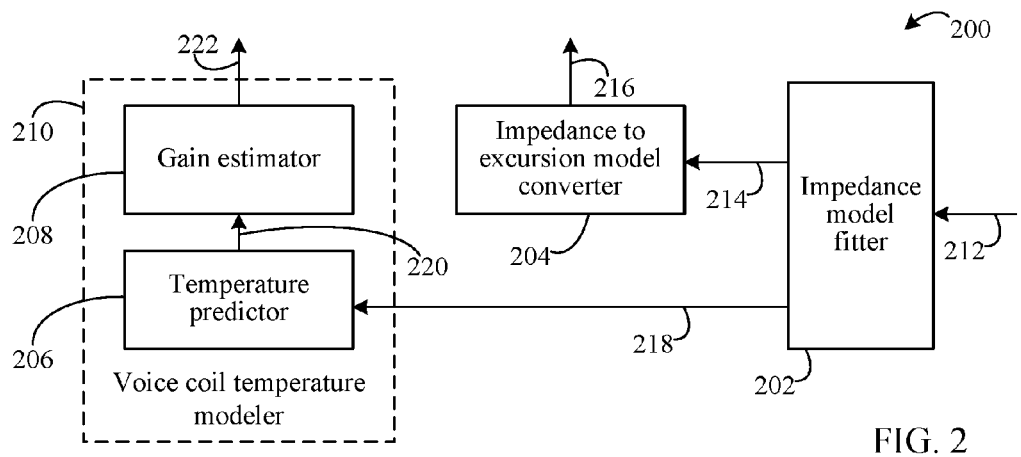
FIG. 2 shows a block diagram of an upstream loudspeaker model estimation component of a loudspeaker protection system, according to an example embodiment.

FIG. 2 shows a block diagram of an upstream loudspeaker model estimation component 200 of a loudspeaker protection system, according to an embodiment. Upstream loudspeaker model estimation component 200 may be a further embodiment of upstream loudspeaker model estimation component 104 of FIG. 1A. Upstream loudspeaker model estimation component 200 includes an impedance model fitter 202, an impedance to excursion model converter 204, a temperature predictor 206, and a gain estimator 208. In embodiments, temperature predictor 206 and gain estimator 208 may together comprise a voice coil temperature modeler 210.

Figure 3:
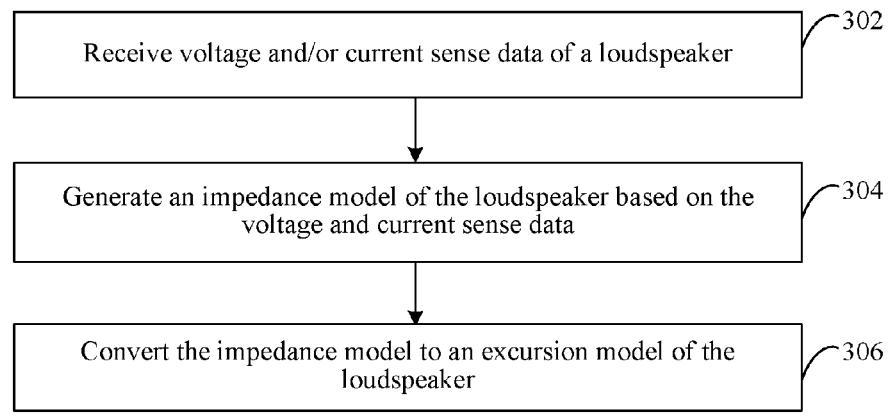
FIG. 3 shows a flowchart for model generation by the upstream loudspeaker model estimation component of FIG. 2, according to an example embodiment.

Referring also to FIG. 3, a flowchart 300 for model generation by upstream loudspeaker model estimation component 200 of FIG. 2 is shown, according to an embodiment. Upstream loudspeaker model estimation component 200, along with its subcomponents such as impedance model fitter 202 and impedance to excursion model converter 204, may be configured to perform their respective functions in accordance with flowchart 300. Flowchart 300 is described as follows.

Voltage and current sense data of a loudspeaker are received (302). For example, impedance model fitter 202 is configured to receive voltage and current sense data for a loudspeaker and/or a voice coil thereof, such as loudspeaker 106 of FIG. 1A, via a connector 212 from a voltage sensor and a current sensor (not shown) electrically coupled to the loudspeaker. The received voltage and current sense data are operational data sensed during operation of the loudspeaker, e.g., during playback of audio, according to embodiments, and may be voltage and current sense data of a voice coil of the loudspeaker. In embodiments, indicia of the voltage and current sense data may be received.

An impedance model of the loudspeaker is generated based on the voltage and current sense data (304). For instance, impedance model fitter 202 is configured to generate the impedance model of the loudspeaker based on the voltage and current sense data. That is, based on the received sense data, or indicia, an impedance estimate in the frequency domain may be generated, e.g., illustrated in the Laplace domain, according to impedance 'Z' being equal to voltage 'U' divided by current 'I' as a function of frequency:

$$U(s)=I(s)Z(s), \qquad (Eq. 1)$$

solving for Z, $$|Z(s)| = \frac{|U(s)|}{|I(s)|}. \qquad (Eq. 2)$$

The impedance model may include one or more components (or impedance components) such as resistivity, inductance, primary resonance, and secondary resonance. The parameters of the components are estimated by fitting the impedance model to the impedance estimate (the observed impedance of the loudspeaker calculated from the sensed voltage and current during general audio playback).

The impedance model is converted to an excursion model of the loudspeaker (306). For instance, impedance to excursion model converter 204 is configured to convert the impedance model to an excursion model of the loudspeaker. Impedance to excursion model converter 204 is configured to receive the impedance model from impedance model fitter 202, via a connector 214, and to generate the excursion model based on the conversion of one or more components of the impedance model, and a force factor 'φ' of the loudspeaker that may be provided by a manufacturer or derived from operation of the loudspeaker. In embodiments, the excursion model may be generated by conversion with or without taking the secondary resonance component into account.

The excursion model generated by conversion at impedance to excursion model converter 204 may be provided via a connector 216 to downstream processing circuitry or a downstream processing component, such as in downstream audio signal processing component 102 of FIG. 1A or as described in additional detail below with respect to FIG. 14, for use in the processing of audio signals.

Temperature predictor 206 is configured to receive a resistivity portion of the impedance model, as described above, via a connector 218, and to model or predict the temperature of the voice coil of the loudspeaker based thereon. In embodiments, a temperature model may be used to generate voice coil temperature prediction. That is, a voice coil temperature estimation/prediction 'T' may be based on resistivity variation with temperature. Temperature predictor 206 is configured to provide the temperature prediction to gain estimator 208 via a connector 220.

Gain estimator 208 is configured to receive the predicted voice coil temperature modeled by temperature predictor 206. Based on an estimated/predicted temperature T, and a specified $T_{max}$ of the voice coil (i.e., a maximum temperature above which continuous operation is not desired, as described herein), gain estimator 208 is configured to perform a heuristic method to calculate a full-band attenuation, $Gain_T$, of the audio signal, i.e., a gain change parameter. The gain change parameter may be an actual gain value, e.g., 0.8 when normal operational gain is 1.0, or may be a gain delta, e.g., 0.2 to achieve an effective gain of 0.8, according to embodiments. In such cases, the gain change parameter lowers the overall effective power of the audio signal, thus reducing the temperature of the voice coil. The gain change parameter may be 1.0, or a gain delta of 0.0, when it is not desired to lower the voice coil temperature, as described in further detail herein. In embodiments, a faster rate of increase for temperature T may result in the generation of a gain change parameter that reduces the overall effective gain more than a relatively slower rate of increase for temperature T. The gain change parameter may be provided to a temperature-constraining processing component, in embodiments. Gain estimator 208 may provide the gain change parameter to such temperature-constraining processing circuitry, e.g., of downstream audio signal processing component 102 of FIG. 1A or as described in additional detail below with respect to FIG. 14, via a connector 222.

Figure 4:
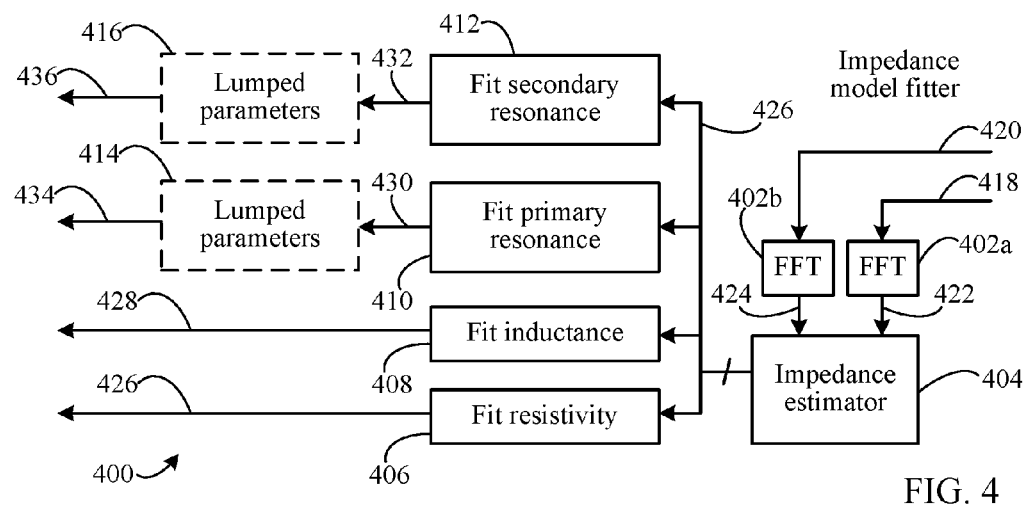
FIG. 4 shows a block diagram of an impedance model fitter of an upstream loudspeaker model estimation component of a loudspeaker protection system, according to an example embodiment.

FIG. 4 shows a block diagram of an impedance model fitter 400 that may be a portion of an upstream model estimation component in embodiments, e.g., of upstream loudspeaker model estimation component 200 of FIG. 2. Impedance model fitter 400 may be a further embodiment of impedance model fitter 202 of FIG. 2. Impedance model fitter 400 includes an impedance estimator 404, a fit resistivity component 406, a fit inductance component 408, a fit primary resonance component 410, and a fit secondary resonance component 412. In embodiments, impedance model fitter 400 also includes a first lumped parameters component 414 and a second lumped parameters component 416 which may be part of a single lumped parameters component in some configurations.

Figure 5:
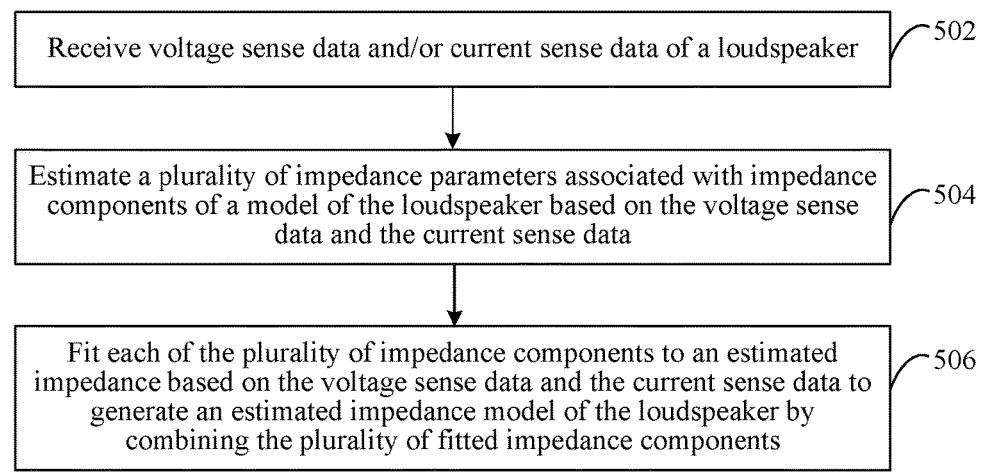
FIG. 5 shows a flowchart for impedance model estimation by the impedance model fitter of FIG. 4, according to an example embodiment.

Referring also to FIG. 5, a flowchart 500 for impedance model estimation by impedance model fitter 400 of FIG. 4 is shown, according to an embodiment. Upstream loudspeaker model estimation component 200 of FIG. 2, along with its subcomponents such as impedance model fitter 202, and impedance model fitter 400 of FIG. 4, may be configured to perform their respective functions in accordance with flowchart 500. Flowchart 500 is described as follows.

Voltage sense data and current sense data of a loudspeaker are received (502). For example, impedance model fitter 400 is configured to receive voltage sense data and current sense data for a loudspeaker and/or a voice coil thereof, such as loudspeaker 106 of FIG. 1A, respectively via a connector 418 and a connector 420. Voltage sense data and current sense data may be received from a voltage sensor and a current sensor (not shown) electrically coupled to the loudspeaker. The received voltage sense data and current sense data are operational data sensed during operation of the loudspeaker, e.g., during playback of audio, according to embodiments, and may be sensed voltage and current data of a voice coil of the loudspeaker, e.g., as illustrated in FIG. 1C. In embodiments, indicia of the voltage sense data and current sense data may be received.

In embodiments, the received voltage sense data and current sense data on connector 418 and connector 420 may be passed through respective fast Fourier transforms (FFTs): FFT 402a and FFT 402b. The resulting, transformed voltage sense data and current sense data signals in the frequency domain may then be provided to impedance estimator 404 respectively via a connector 422 and a connector 424 as shown.

A plurality of impedance parameters associated with impedance components of the loudspeaker are estimated based on the voltage sense data and the current sense data (504). For instance, impedance estimator 404 is configured to receive the frequency domain signals representative of the voltage sense data and the current sense data respectively via a connector 422 and a connector 424, and estimate the impedance of the loudspeaker according to Equations 1 & 2 described above. The resulting impedance estimate Z(s), voltage U(s) divided by current I(s), may include one or more impedance components as also described above: resistivity 'R,' inductance 'Ls', primary resonance, and/or secondary resonance. Each of these components may include one or more associated parameters. Based on the estimated impedance Z(s), impedance estimator 404 is also configured to estimate the impedance components and the associated parameters for the impedance components.

As shown in the Laplace domain, the transform of the voltage U(s) may be represented as a sum of the resistivity multiplied by the transform of the current I(s), the inductance multiplied by the transform of the current I(s) and 's', and a transform of the cone excursion 'X(s)' multiplied by 's' that is modified by φ (i.e., a force factor, power factor, or induction factor of the loudspeaker, hereinafter "force factor"), as shown below in Equation 3. The differential equation related to electrical side of the loudspeaker, governing the behavior, is:

$$U(s)=RI(s)+LsI(s)+\phi sX(s). \tag{Eq. 3}$$

This can be combined with an observed electrical impedance:

$$Z(s)=Z_1(s)+Z_2(s)+Z_3(s)+Z_6(s), \tag{Eq. 4}$$

with the impedance components, comprising one or more impedance parameters, being:

$Z_1(s)=R$ (voice coil resistivity), $Z_2(s)=Ls$ (voice coil inductance), $$Z_3(s) = \frac{s\phi^2}{ms^2 + rs + \frac{1}{c}}$$

(primary resonance (mechanical)), and $$Z_6(s) = \frac{s}{C_6 s^2 + \frac{1}{R_6}s + \frac{1}{L_6}}$$

(secondary resonance),
to form the voice coil voltage to cone excursion that takes the secondary resonance in the impedance into account, where for $Z_3(s)$, the parameter 'm' is the mass of the moving loudspeaker system, the parameter 'r' is the mechanical resistance of the loudspeaker driver suspension, and the parameter 'c' is the compliance of driver suspension (1/k or 1/mechanical-stiffness), and for the electrical equivalent of $Z_6(s)$, capacitor '$C_6$', resistor '$R_6$', and inductor '$L_6$', in parallel as lumped parameters, are:

$$C_6 = m_2/\phi_2^2, \ R_6 = \phi_2^2/r_2, \text{ and } L_6 = c_2\phi_2^2 = \phi_2^2/k_2.$$

The parameters of $Z_6(s)$, the secondary resonance component, may be denoted with a subscript of '2' for clarity and naming convention purposes.

The voice coil voltage to cone excursion transform may be represented as:

$$U(s) = (Z_1(s) + Z_2(s))\frac{U(s)}{Z(s)} + \phi s X(s) \Leftrightarrow \quad \text{(Eq. 5)}$$

$$U(s)\left(1 - \frac{Z_1(s) + Z_2(s)}{Z(s)}\right) = \phi s X(s) \Leftrightarrow$$

$$\frac{X(s)}{U(s)} = \frac{1}{\phi s} \frac{Z_3(s) + Z_6(s)}{Z_1(s) + Z_2(s) + Z_3(s) + Z_6(s)}.$$

The secondary resonance may be a result of the specific acoustic design of a loudspeaker enclosure with acoustic radiation through a narrowing "port". It should be noted that if consideration to the secondary resonance is desirable, then the term representing it can likely be fixed as it reflects physical dimensions of the enclosure which are not subject to change due to manufacturing variations, temperature, or other environmental factors.

The voice coil resistivity R provides the general level of the impedance and dominates the impedance at low frequencies $Z_{LF}$ (see FIG. 6 as described below). Hence, the resistivity R can be found as the impedance at low frequencies by:

$$|Z_{LF}(\omega)| = R, \quad \text{(Eq. 6)}$$

The voice coil inductance Ls results in an upward linear slope of the impedance estimate, dominating the overall impedance at higher frequencies $Z_{HF}$ (see FIG. 6 as described below). As can be seen from the expression of $Z_2(s)$, the value of the inductance is equal to the slope. Disregarding eddy currents and using a simplified voice coil inductance model, at higher frequencies the magnitude of the impedance is dominated by:

$$|Z_{HF}(\omega)| = |R \times j\omega L|, \quad \text{(Eq. 7)}$$

where R is a non-negligible contribution when the voice coil inductance Ls is small. Using a sum of squared error of squared magnitude of impedance over a frequency range for the cost function, the derivate with respect to the voice coil inductance Ls and resistivity R is derived to:

$$L = \sqrt{\frac{\sum_\omega (|Z(\omega)|^2 - R^2)\omega^2}{\sum_\omega \omega^4}}, \quad \text{(Eq. 8)}$$

for voice coil inductance calculated from the first non-trivial solution, or for a joint optimal solution:

$$L = \sqrt{\frac{(\sum_\omega |Z(\omega)|^2 \omega^2)(\sum_\omega 1) - (\sum_\omega \omega^2)(\sum_\omega |Z(\omega)|^2)}{(\sum_\omega \omega^4)(\sum_\omega 1) - (\sum_\omega \omega^2)^2}}, \quad \text{(Eq. 9)}$$

and $$R = \sqrt{\frac{\sum_\omega |Z(\omega)^2| - L^2 \sum_\omega \omega^2}{\sum_\omega 1}}. \quad \text{(Eq. 10)}$$

The mechanical primary resonance impedance component ($Z_3(s)$ as in the description of Equation 4) is responsible for the primary resonance appearing at lower frequencies of the impedance estimate (see FIG. 6 as described below). The impedance of loudspeaker and enclosure designs for smartphones and other smaller handheld devices typically have their primary resonance in lower frequency ranges (e.g., at or around 1 kHz). Primary resonance impedance component $Z_3(s)$ has a resonance frequency where the square of the magnitude of the numerator has a minimum. The magnitude of the numerator is given by $$\frac{1}{|Z_3(s=j\omega)|^2} = \left|\frac{m}{\phi^2}j\omega + \frac{r}{\phi^2} + \frac{1}{\phi^2 c j\omega}\right|^2 = \quad \text{(Eq. 11)}$$

$$\left|\frac{m}{\phi^2}j\omega + \frac{r}{\phi^2} + \frac{1}{\phi^2 c\omega}j\right|^2 = \left(\frac{m}{\phi^2}\omega - \frac{1}{\phi^2 c\omega}\right)^2 + \left(\frac{r}{\phi^2}\right)^2,$$

which, through the derivative with respect to frequency, yields the primary resonance frequency at:

$$\omega_s = \frac{1}{\sqrt{mc}}. \quad \text{(Eq. 12)}$$

Although the primary resonance frequency may be determined by $Z_3(s)$ alone, the absolute impedance at the resonance frequency is determined by $Z_1(s)+Z_3(s)$, assuming that the contribution of the inductance and a possible secondary resonance is negligible at low frequency.

$$Z_s = \left|Z_1\left(s=j\frac{1}{\sqrt{mc}}\right) + Z_3\left(s=j\frac{1}{\sqrt{mc}}\right)\right| = \quad \text{(Eq. 13)}$$

$$\left|R + \frac{1}{j\frac{m}{\phi^2}\frac{1}{\sqrt{mc}} + \frac{r}{\phi^2} - j\frac{\sqrt{mc}}{\phi^2 c}}\right| = R + \frac{\phi^2}{r}.$$

The two frequencies where the impedance has decreased from its primary resonance value given above to:

$$Z_M = |Z_1(\omega_{L/H}) + Z_3(\omega_{L/H})| = \sqrt{RZ_s}. \quad \text{(Eq. 14)}$$

are denoted $\omega_L$ and $\omega_H$, respectively, and determined from:

$$|Z_1(\omega) + Z_3(\omega)| = \left|R + \frac{1}{j\frac{m}{\phi^2}\omega + \frac{r}{\phi^2} - j\frac{1}{\phi^2 c\omega}}\right| = \quad \text{(Eq. 15)}$$

$$\left|R + \frac{1}{\frac{1}{Z_s - R} + j\left(\frac{m}{\phi^2}\omega - \frac{1}{\phi^2 c\omega}\right)}\right|$$

$$= \sqrt{\frac{(\phi^2 c\omega Z_s)^2 + (Z_s - R)^2 R^2\left(\left(\frac{\omega}{\omega_s}\right)^2 - 1\right)^2}{(\phi^2 c\omega)^2 + (Z_s - R)^2\left(\left(\frac{\omega}{\omega_s}\right)^2 - 1\right)^2}}.$$

Inserting $\omega_L$ and $\omega_H$ and imposing the constraint leads to the following two equations:

$$\frac{(\phi^2 c\omega_L Z_s)^2 + (Z_s - R)^2 R^2 \left(\left(\frac{\omega_L}{\omega_s}\right)^2 - 1\right)^2}{(\phi^2 c\omega_L)^2 + (Z_s - R)^2 \left(\left(\frac{\omega_L}{\omega_s}\right)^2 - 1\right)^2} = RZ_s. \quad \text{(Eq. 16)}$$

$$\frac{(\phi^2 c\omega_H Z_s)^2 + (Z_s - R)^2 R^2 \left(\left(\frac{\omega_H}{\omega_s}\right)^2 - 1\right)^2}{(\phi^2 c\omega_H)^2 + (Z_s - R)^2 \left(\left(\frac{\omega_H}{\omega_s}\right)^2 - 1\right)^2} = RZ_s. \quad \text{(Eq. 17)}$$

Based on these known parameters and the two equations above, it appears that the force-factor and the effective compliance of the driver suspension can be calculated from:

$$\phi^2 c = |Z_s - R| \frac{1}{\omega_s^2} \left|\omega_L - \frac{\omega_s^2}{\omega_L}\right| \sqrt{\frac{(RZ_s - R^2)}{(Z_s^2 - RZ_s)}} = \quad \text{(Eq. 18)}$$

$$|Z_s - R| \frac{1}{\omega_s^2} \left|\omega_L - \frac{\omega_s^2}{\omega_L}\right| \sqrt{\frac{R}{Z_s}},$$

and $$\phi^2 c = |Z_s - R| \frac{1}{\omega_s^2} \left|\omega_H - \frac{\omega_s^2}{\omega_H}\right| \sqrt{\frac{(RZ_s - R^2)}{(Z_s^2 - RZ_s)}} = \quad \text{(Eq. 19)}$$

$$|Z_s - R| \frac{1}{\omega_s^2} \left|\omega_H - \frac{\omega_s^2}{\omega_H}\right| \sqrt{\frac{R}{Z_s}}.$$

However, since $\omega_s = \sqrt{\omega_L \omega_H}$ the two right-hand sides become identical:

$$\left|\omega_H - \frac{\omega_s^2}{\omega_H}\right| = \left|\frac{\omega_s^2}{\omega_L} - \frac{\omega_L \omega_s^2}{\omega_s^2}\right| = \left|-\left(\omega_L - \frac{\omega_s^2}{\omega_L}\right)\right| = \left|\left(\omega_L - \frac{\omega_s^2}{\omega_L}\right)\right| \text{ q.e.d.} \quad \text{(Eq. 20)}$$

Intuitively, this also makes sense, as ($\phi^2 c$) cannot take on two different results.

If the (equivalent) mass is known then the parameters can be calculated according to:

$$c = \frac{1}{\omega_s^2 m},$$

$$\phi^2 = m|Z_s - R| \left|\omega_H - \frac{\omega_s^2}{\omega_H}\right| \sqrt{\frac{R}{Z_s}}, \text{ and}$$

$$r = \frac{\phi^2}{Z_s - R} = m\left|\omega_H - \frac{\omega_s^2}{\omega_H}\right| \sqrt{\frac{R}{Z_s}}.$$

Figure 6:
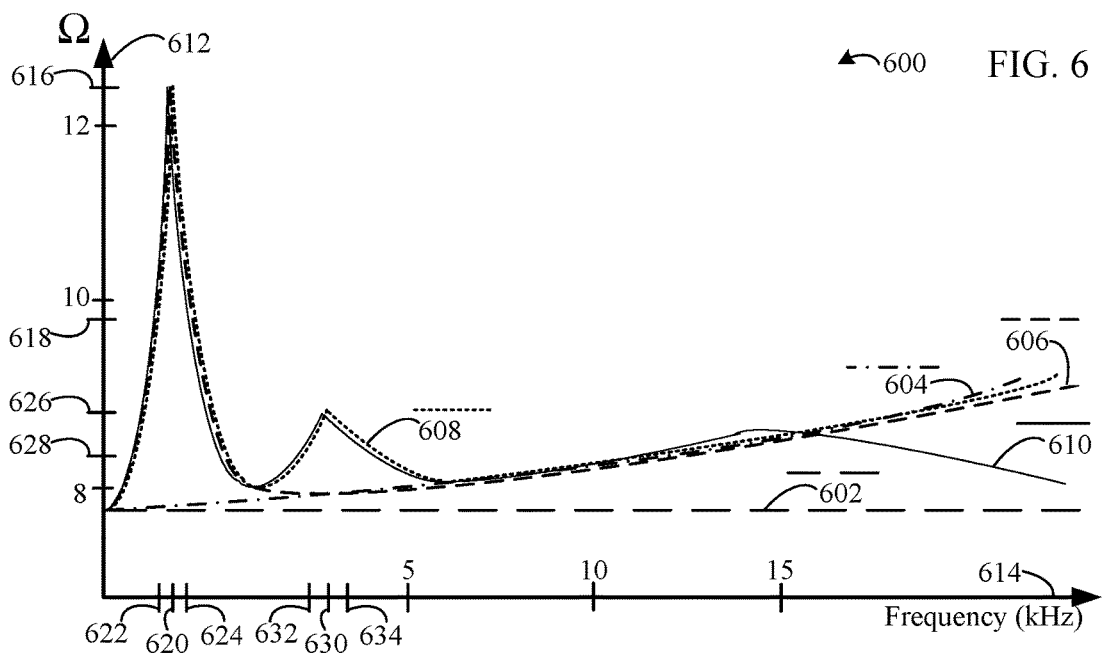
FIG. 6 shows a fitted estimated impedance model, according to an example embodiment.

The results of fitting a primary resonance according to the above equations in addition to fitting of the voice coil resistivity and induction is shown in FIG. 6. Fittings, as described herein, may be based on separately- or jointly-estimated resistivity and induction. As should be expected, the mass can be set arbitrarily, resulting in identical model impedance. It should be noted that these are lumped parameters (given the set mass) as opposed to actual physical loudspeaker parameters as the moving mass, the volume of enclosure, and the diaphragm area are unknown, and hence, cannot be backed out of the lumped parameters to get the physical loudspeaker parameters. However, this is not important to the present application where the lumped parameters (given the set mass) are sufficient to model the impedance. In other words, if the mass is set differently, then the estimated lumped loudspeaker parameters change, and leave the resulting model of the impedance unchanged.

However, this is not the case for the voice coil voltage to cone excursion transfer function which is given above as $$\frac{X(s)}{U(s)}$$

in Equation 5. If the impedances remain unchanged, but the force factor $\phi$ changes, then the excursion transfer function also changes. Hence, an estimate of the actual mass may be needed in some embodiments in order to render the excursion transfer function uniquely determined The issue of an under-determined system, in the sense of estimating the core four loudspeaker parameters from the primary resonance of the impedance, is also evident from the expression of the sub-impedance:

$$Z_3(s) = \frac{1}{\frac{m}{\phi^2}s + \frac{r}{\phi^2} + \frac{1}{\phi^2 cs}}. \quad \text{(Eq. 21)}$$

The three independent parameters determining the sub-impedance are:

$$\frac{m}{\phi^2}, \frac{r}{\phi^2},$$

and $\phi^2 c$.

From these three independent lumped parameters, it is not possible to calculate the four core loudspeaker parameters $\phi^2$, m, r, c. The three independent lumped parameters above uniquely determine the impedance, but as also noted above, the four core loudspeaker parameters are required to determine the voice coil voltage to cone excursion transfer function, which is needed in order to predict the cone movement as part of the loudspeaker protection, in embodiments. Hence, either one of the core loudspeaker parameters must be known, e.g., from the manufacturer, and reasonably assumed fixed, or an additional measurement may be required, facilitating the break-down of the three lumped parameters into the four core parameters. Consequently, it is sensible to specify the sub-component responsible of the primary resonance of the impedance in terms of the lumped parameters, and in terms of traditional lumped parameters as used for the secondary resonance component $Z_6(s)$ the sub-impedance is specified as $$Z_3(s) = \frac{s}{C_3 s^2 + \frac{1}{R_3}s + \frac{1}{L_3}}, \quad \text{(Eq. 22)}$$

where $$C_3 = \frac{m}{\phi^2}$$

(electrical capacitance representing mechanical mass), $$R_3 = \frac{\phi^2}{r}$$

(resistance due to mechanical losses), and
$L_3 = \phi^2 c$ (electrical inductance representing mechanical compliance).

In terms of estimating the lumped parameters directly from the parameters for resistivity R, resonance frequency $\omega_s$, impedance at resonance frequency $Z_s$, the low frequency corresponding to geometric mean impedance $\omega_L$, and the high frequency corresponding to geometric mean impedance $\omega_H$, estimated from the measured impedance, the simplified solutions below in Equations and parameters described for the secondary resonance component apply directly as the voice coil inductance is negligible at the frequency of the primary resonance. Note that the compliance, c, is a lumped parameter also including the effect of an enclosure, in embodiments:

$$R_3 = Z_s - R,$$

$$L_3 = \frac{1}{\omega_L}|Z_s - R|\left|\left(\frac{\omega_L}{\omega_s}\right)^2 - 1\right|\sqrt{\frac{R}{Z_s}}, \text{ and}$$

$$C_3 = \frac{1}{\omega_s^2 L_3}.$$

Beyond the lumped parameters, the force-factor $\phi$ may be specifically estimated in embodiments to uniquely determine the voice coil voltage to cone excursion transfer function. Estimating, or knowing, any one of the four core loudspeaker parameters will allow unique identification of the force-factor, and consequently, the excursion transfer function. A consideration to manufacturing, aging, and/or environmentally induced changes to the parameters may be used in embodiments for determining if any one parameter can be considered fixed, and if it is known or easily measurable.

In embodiments, the nominal force-factor specified by the manufacturer of the loudspeaker may be used. If it is associated with a tolerance, $\alpha_\phi$:

$$\phi = (1 \pm \alpha_\phi)\phi_{nom}. \tag{Eq. 23}$$

As can be seen from the transfer function in Equation 5 above, it is straightforward to incorporate this tolerance into the maximum excursion by lowering it with a corresponding factor, i.e.:

$$x_{max} = (1-\alpha_\phi)x_{max_{nom}}. \tag{Eq. 24}$$

In embodiments, the lower end force-factor may be used as:

$$\phi = (1-\alpha_\phi)\phi_{nom}, \tag{Eq. 25}$$

to obtain the worst case possible excursion, and leave the maximum excursion, $x_{max}$, as specified by the manufacturer $x_{max} = x_{max_{nom}}$. Either case assumes that only manufacturing variance affects the force-factor $\phi$, i.e., that no change due to aging, temperature, or other environmental factor, although such considerations may be taken into account in embodiments.

In embodiments, the primary resonance and its parameters $\omega_s$, $Z_s$, $\omega_L$, and $\omega_H$ may be identified from a measured impedance by focusing on the 500 Hz to 2000 Hz frequency range, which is a typical range for a primary resonance of a microspeaker and enclosure for some devices such as mobile and smart phones.

In some cases, deriving the impedance in the vicinity of the primary resonance does not lead to a tractable direct-form solution for the primary resonance parameters. However, a measure of model fit of an existing parameter set may be determined according to:

$$E_{fit} = \sum_\omega \||Z(\omega)| - |Z_1(\omega) + Z_3(\omega)|\| \tag{Eq. 26}$$

$$= \sum_\omega \left\||Z(\omega)| - \left|\frac{RR_3(1-C_3L_3\omega^2) + j\omega L_3(R_3+R)}{R_3(1-C_3L_3\omega^2) + jL_3\omega}\right|\right\|.$$

In cases where tractable direct-form solutions for the primary resonance parameters are not available, the entire excursion modeling may be temporarily disabled if the primary resonance does not provide an adequate fit to the estimated impedance. The measure of model fit at the primary resonance in Equation 24 may be expanded as:

$$\tag{Eq. 27}$$

$$E_{fit} = \sum_\omega \left||Z(\omega)| - \left|\frac{\left(\begin{array}{c}RR_3(1-C_3L_3\omega^2)+ \\ j\omega L_3(R_3+R)\end{array}\right)(R_3(1-C_3L_3\omega^2) - jL_3\omega)}{R_3^2(1-C_3L_3\omega^2)^2 + (L_3\omega)^2}\right|\right|$$

$$= \sum_\omega \left||Z(\omega)| - \frac{\sqrt{(RR_3^2(1-C_3L_3\omega^2)^2 + (L_3\omega)^2(R_3+R))^2 + (L_3\omega R_3^2(1-C_3L_3\omega^2))^2}}{R_3^2(1-C_3L_3\omega^2)^2 + (L_3\omega)^2}\right|.$$

The frequency range for the measurement of the model fit can be constrained to the search area for the primary resonance, or it can include all lower frequencies from essentially or approximately DC (0 Hz) to the upper search limit for the primary resonance. A full-band fit could also be used in embodiments. Instead of using an absolute measure of fit to the impedance, it may be beneficial to measure the relative improvement to the fit by adding the primary resonance. This could be according to:

$$\tag{Eq. 28}$$

$$E_{fit} = \frac{\sum_\omega \||Z(\omega)| - |Z_1(\omega)|\|}{\sum_\omega \||Z(\omega)| - |Z_1(\omega) + Z_3(\omega)|\|} =$$

$$\frac{\sum_\omega ||Z(\omega)| - R|}{\sum_\omega \left| |Z(\omega)| - \frac{\sqrt{(RR_3^2(1-C_3L_3\omega^2)^2 + (L_3\omega)^2(R_3+R))^2 + (L_3\omega R_3^2(1-C_3L_3\omega^2))^2}}{R_3^2(1-C_3L_3\omega^2)^2 + (L_3\omega)^2} \right|}.$$

This will provide a measure of the relative importance of including the primary resonance to accurately model the impedance, and it can be omitted if its contribution is not significant, as is the case at high excursion where the impedance typically can be accurately modeled by:

$$Z(s) = Z_1(s) + Z_2(s) = R + Ls, \quad \text{(Eq. 29)}$$

i.e., only including the voice coil resistivity and voice coil inductance.

The secondary resonance impedance component ($Z_6(s)$ as in the description of Equation 4), is responsible for the secondary resonance appearing between lower frequencies and mid-ranges frequencies of the impedance estimate (see FIG. 6 as described below), e.g., at and/or around approximately 4 kHz. Equivalent to Equation 12 above with respect to the primary resonance, the resonance frequency is given by:

$$\omega_s = \frac{1}{\sqrt{C_6 L_6}}. \quad \text{(Eq. 30)}$$

However, while magnitude of the impedance at the primary resonance is largely determined by $Z_1(s)+Z_3(s)$, at the secondary resonance the inductance may start to take on a non-negligible size in some embodiments. Hence, at the secondary resonance, the inductance may need to be taken into consideration when finding the impedance at the resonance frequency.

$$R_6 = \sqrt{Z_s^2 - (\omega_s L)^2} - R, \text{ and} \quad \text{(Eq. 31)}$$

$$(R+R_6)^2 = Z_s^2 - (\omega_s L)^2. \quad \text{(Eq. 32)}$$

Likewise, as similarly described above for the primary resonance, the two frequencies where the impedance has decreased from its secondary resonance value given above to:

$$Z_M = |Z_1(\omega_{L/H}) + Z_2(\omega_{L/H}) + Z_6(\omega_{L/H})| = \sqrt{RZ_s}, \quad \text{(Eq. 33)}$$

are denoted $\omega_L$ and $\omega_H$, respectively, and determined from:

$$\begin{aligned}
|Z_1(\omega) + Z_2(\omega) + Z_6(\omega)| &= \left| R + j\omega L + \frac{1}{j\omega C_6 + \frac{1}{R_6} - j\frac{1}{L_6\omega}} \right| \\
&= \left| R + j\omega L + \frac{1}{\frac{1}{R_6} + j\left(\omega C_6 - \frac{1}{L_6\omega}\right)} \right| \\
&= \left| R + j\omega L + \frac{1}{\frac{1}{R_6} + j\frac{1}{L_6\omega}\left(\left(\frac{\omega}{\omega_s}\right)^2 - 1\right)} \right| \\
&= \left| \frac{\omega\left(L_6(R_6+R) - LR_6\left(\left(\frac{\omega}{\omega_s}\right)^2 - 1\right)\right) + j\left(\omega^2 LL_6 + RR_6\left(\left(\frac{\omega}{\omega_s}\right)^2 - 1\right)\right)}{L_6\omega + jR_6\left(\left(\frac{\omega}{\omega_s}\right)^2 - 1\right)} \right| \Rightarrow,
\end{aligned} \quad \text{(Eq. 34)}$$

and $$\begin{aligned}
|Z_1(\omega) + Z_2(\omega) + Z_6(\omega)|^2 &= \frac{\omega^2\left(L_6(R_6+R) - LR_6\left(\left(\frac{\omega}{\omega_s}\right)^2 - 1\right)\right)^2 + \left(\omega^2 LL_6 + RR_6\left(\left(\frac{\omega}{\omega_s}\right)^2 - 1\right)\right)^2}{(L_6\omega)^2 + R_6^2\left(\left(\frac{\omega}{\omega_s}\right)^2 - 1\right)^2} \\
&= \frac{\left(\left(\frac{\omega}{\omega_s}\right)^2 - 1\right)^2((\omega L R_6)^2 + (RR_6)^2) + (\omega^2 LL_6)^2 + \omega^2(L_6(R_6+R))^2 - 2\omega^2 L_6 L R_6^2\left(\left(\frac{\omega}{\omega_s}\right)^2 - 1\right)}{(L_6\omega)^2 + R_6^2\left(\left(\frac{\omega}{\omega_s}\right)^2 - 1\right)^2} \\
&= \frac{L_6^2((\omega^2 L)^2 + \omega^2(R_6+R)^2) - 2\omega^2 L_6 L R_6^2\left(\left(\frac{\omega}{\omega_s}\right)^2 - 1\right) + ((\omega L)^2 + R^2)R_6^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2} \\
&= \frac{\omega^2 L_6\left(L_6(\omega L)^2 + L_6(R_6+R)^2 - 2LR_6^2\left(\left(\frac{\omega}{\omega_s}\right)^2 - 1\right)\right) + ((\omega L)^2 + R^2)R_6^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2}.
\end{aligned} \quad \text{(Eq. 35)}$$

For embodiments where the inductance of the voice coil is negligible, Equation 35 simplifies to:

$$|Z_1(\omega) + Z_2(\omega) + Z_6(\omega)|^2 \approx |Z_1(\omega) + Z_6(\omega)|^2$$

$$= \frac{\omega^2(L_6(R_6+R))^2 + (RR_6)^2\left(\left(\frac{\omega}{\omega_s}\right)^2-1\right)^2}{(L_6\omega)^2 + R_6^2\left(\left(\frac{\omega}{\omega_s}\right)^2-1\right)^2}$$

$$= \frac{L_6^2(\omega(R_6+R))^2 + (RR_6)^2\left(\left(\frac{\omega}{\omega_s}\right)^2-1\right)^2}{(L_6\omega)^2 + R_6^2\left(\left(\frac{\omega}{\omega_s}\right)^2-1\right)^2},$$

(Eq. 36)

and at the lower geometric mean frequency, this equals:

$$Z_M^2 = |Z_1(\omega_L) + Z_6(\omega_L)|^2 =$$ (Eq. 37)

$$\frac{L_6^2(\omega_L(R_6+R))^2 + (RR_6)^2\left(\left(\frac{\omega_L}{\omega_s}\right)^2-1\right)^2}{(L_6\omega)^2 + R_6^2\left(\left(\frac{\omega_L}{\omega_s}\right)^2-1\right)^2} = RZ_s \Leftrightarrow$$

$$L_6^2\omega_L^2((R_6+R)^2 - RZ_s) = RR_6^2(Z_s-R)\left(\left(\frac{\omega_L}{\omega_s}\right)^2-1\right)^2$$

$$L_6^2\omega_L^2 Z_s(Z_s-R) = R(Z_s-R)^3\left(\left(\frac{\omega_L}{\omega_s}\right)^2-1\right)^2 \Leftrightarrow$$

-continued $$L_6^2 = \frac{R}{Z_s}\frac{1}{\omega_L^2}(Z_s-R)^2\left(\left(\frac{\omega_L}{\omega_s}\right)^2-1\right)^2 \Rightarrow$$

$$L_6 = \frac{1}{\omega_L}|Z_s-R|\left|\left(\frac{\omega_L}{\omega_s}\right)^2-1\right|\sqrt{\frac{R}{Z_s}}.$$

Accordingly, in embodiments, if the impedance of the voice coil inductance is negligible at the secondary resonance, then the three parameters responsible for the secondary resonance can be found from the measured properties ($\omega_s$, $Z_s$, and $\omega_L$) of the secondary resonance as:

$$R_6 = Z_s - R,$$

$$L_6 = \frac{1}{\omega_L}|Z_s-R|\left|\left(\frac{\omega_L}{\omega_s}\right)^2-1\right|\sqrt{\frac{R}{Z_s}}, \text{ and}$$

$$C_6 = \frac{1}{\omega_s^2 L_6}.$$

As similarly applied in Equation 26 above for the primary resonance, a measure of fitment of the secondary resonance may be useful. While a poor fit of the primary resonance may be relevant in terms of disregarding an excursion modeling entirely, a poor fit of the secondary resonance may be relevant in terms of excluding that particular sub-component from the impedance model. The absolute measure of fit of the secondary resonance in the relevant frequency range (where the primary resonance is disregarded) may be expressed as:

$$E_{fit} = \sum_\omega \||Z(\omega)| - |Z_1(\omega) + Z_2(\omega) + Z_6(\omega)|\|$$

$$= \sum_\omega \left||Z(\omega)| - \frac{\sqrt{(RR_6^2(1-C_6L_6\omega^2)^2 + (\omega L_6)^2(R_6+R))^2 + \omega^2((L(1-C_6L_6\omega^2)+L_6)R_6^2(1-C_6L_6\omega^2) + L(\omega L_6)^2)^2}}{R_6^2(1-C_6L_6\omega^2)^2 + (L_6\omega)^2}\right|.$$ (Eq. 39)

Again, similar to the primary resonance as noted above, the relative measure of fit of the secondary resonance is measured as the relative improvement to the fit by adding the secondary resonance:

(Eq. 40)

$$E_{fit} = \frac{\sum_\omega \||Z(\omega)| - |Z_1(\omega) + Z_2(\omega)|\|}{\sum_\omega \||Z(\omega)| - |Z_1(\omega) + Z_2(\omega) + Z_6(\omega)|\|}$$

$$= \frac{\sum_\omega \left||Z(\omega)| - \sqrt{R^2 + (\omega L)^2}\right|}{\sum_\omega \left||Z(\omega)| - \frac{\sqrt{(RR_6^2(1-C_6L_6\omega^2)^2 + (\omega L_6)^2(R_6+R))^2 + \omega^2((L(1-C_6L_6\omega^2)+L_6)R_6^2(1-C_6L_6\omega^2) + L(\omega L_6)^2)^2}}{R_6^2(1-C_6L_6\omega^2)^2 + (L_6\omega)^2}\right|}.$$ (Eq. 41)

Turning again to FIG. 5 and flowchart 500, each of the plurality of impedance components are fitted to an estimated impedance based on the voltage sense data and the current sense data to generate an estimated impedance model of the loudspeaker by combining the plurality of fitted impedance components (506). For example, impedance model fitter 400 is configured to fit the impedance components described above that are based on the voltage sense data and the current sense data used to estimate the impedance, including parameters thereof in embodiments, to generate an estimated impedance model using fitting components: fit resistivity component 406, fit inductance component 408, fit primary resonance component 410, and fit secondary resonance component 412. Each of these fitting components may receive its respective impedance estimation portion from impedance estimator 404 via a connector 426, in embodiments, while in other embodiments the entire impedance estimate may be provided via connector 426 and each fitting component may extract its appropriate impedance components and/or parameters.

It should be noted, however, that in embodiments, any number of components and/or parameters may be estimated and/or fitted according to flowchart 500. It is also contemplated herein that in some embodiments, fit resistivity component 406, fit inductance component 408, fit primary resonance component 410, and fit secondary resonance component 412 may be included together as a single fitting component.

Referring now to FIG. 6, a fitted estimated impedance model 600 is shown, according to embodiments. Fitted estimated impedance model 600 is shown with respect to an impedance axis 612 and a frequency axis 614, although in embodiments other domains may be used. Also shown in FIG. 6 is an example measured impedance 610, e.g. by impedance estimator 404 of FIG. 4, benchmark against which the fitted impedance components may be visualized.

Also referring to FIG. 4 again, fitted estimated impedance model 600 includes a fitted estimated impedance model 602 that is fitted by fit resistivity component 406 using only resistivity, a fitted estimated impedance model 604 that is fitted by fit resistivity component 406 and fit inductance component 408 using resistivity and inductance, a fitted estimated impedance model 606 that is fitted by fit resistivity component 406, fit inductance component 408, and fit primary resonance component 410, and a fitted estimated impedance model 608 that is fitted by fit resistivity component 406, fit inductance component 408, fit primary resonance component 410, and fit secondary resonance component 412. That is, each fitted estimated impedance model illustrated shows the refinement for fitted estimated impedance models using additional components.

As shown, primary resonance portion 606 has a peak impedance $Z_S$ 616 at a primary resonance frequency $\omega_S$ 620, a low frequency $\omega_L$ 622 corresponding to a geometric mean impedance $Z_M$ 618, and a high frequency $\omega_H$ 624 corresponding to geometric mean impedance $Z_M$ 618. Likewise, secondary resonance portion 608 has a peak impedance $Z_S$ 626 at a primary resonance frequency $\omega_S$ 630, a low frequency $\omega_L$ 632 corresponding to a geometric mean impedance $Z_M$ 628, and a high frequency $\omega_H$ 634 corresponding to geometric mean impedance $Z_M$ 628.

As noted herein, e.g., with respect to Equations 8-10, impedance model fitter 400 is configured to fit resistivity and inductance components jointly or separately using fit resistivity component 406 and fit inductance component 408.

The approximate impedance estimate based on fitted estimated impedance model 600, according to the techniques and embodiment described herein, is fitted to the measured impedance up to approximately 17 kHz.

Fit resistivity component 406 is configured to provide the fit, estimated resistivity to other portions of a loudspeaker protection system via a connector 426, fit inductance component 408 is configured to provide the fit, estimated inductance to other portions of a loudspeaker protection system via a connector 428, fit primary resonance component 410 is configured to provide the fit, estimated primary resonance to other portions of a loudspeaker protection system via a connector 430, and fit secondary resonance component 412 is configured to provide the fit, estimated secondary resonance to other portions of a loudspeaker protection system via a connector 432. For instance, the fit, estimated resistivity may be provided to voice coil temperature modeler 210 and/or temperature predictor 206 of FIG. 2, and/or to impedance to excursion model converter 204, in embodiments. Likewise, the fit, estimated inductance, primary resonance, and secondary resonance may be provided to impedance to excursion model converter 204 of FIG. 2, in embodiments.

Figure 7A:
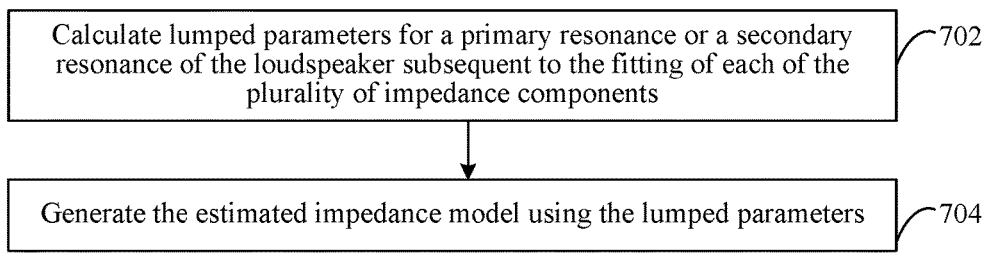
FIG. 7A shows a flowchart for impedance model estimation by the impedance model fitter of FIG. 4, according to an example embodiment.

In FIG. 7A, a flowchart 700A for impedance model estimation by the impedance model fitter 400 of FIG. 4 is shown, according to an embodiment. Upstream loudspeaker model estimation component 200 of FIG. 2, along with its subcomponents such as impedance model fitter 202, and impedance model fitter 400 of FIG. 4, along with its subcomponents such as first lumped parameters component 414 and second lumped parameters component 416, may be configured to perform their respective functions in accordance with flowchart 700A. Flowchart 700A is described as follows.

Lumped parameters for a primary resonance or a secondary resonance of the loudspeaker are calculated subsequent to the fitting of each of the plurality of impedance components (702). The calculation in (702) may be performed as part of the fitting of impedance components in (506) of flowchart 500 in FIG. 5, described above. For example, first lumped parameters component 414 is configured to calculate lumped parameters, as described above, for the primary resonance component of the estimated impedance model (e.g., fitted primary resonance component 606 of FIG. 6). One or more portions of the primary resonance component estimated in fit primary resonance component 410 are provided to first lumped parameters component 414 via a connector 430 to be used for calculating the lumped parameters for the primary resonance component of the estimated impedance model. Second lumped parameters component 416 is configured to calculate lumped parameters, as described above, for the secondary resonance component of the estimated impedance model (e.g., fitted secondary resonance component 608 of FIG. 6). One or more portions of the secondary resonance component estimated in fit secondary resonance component 412 are provided to second lumped parameters component 416 via a connector 432 to be used for calculating the lumped parameters for the secondary resonance component of the estimated impedance model. It is contemplated that in embodiments lumped parameters may be calculated for one, both, or neither of the impedance components for primary and secondary resonances.

The estimated impedance model are generated using the lumped parameters (704). For instance, impedance components for primary and secondary resonances that include the lumped parameters may be respectively output as part of the estimated impedance model on a connector 434 and a connector 436.

In FIG. 7B, a flowchart 700B for impedance model estimation by the impedance model fitter 400 of FIG. 4 is shown, according to an embodiment. Upstream loudspeaker model estimation component 200 of FIG. 2, along with its subcomponents such as impedance model fitter 202, and impedance model fitter 400 of FIG. 4, along with its subcomponents, may be configured to perform their respective functions in accordance with flowchart 700B. Flowchart 700B is described as follows.

The estimated impedance model of the loudspeaker is generated by combining less than all of the plurality of fitted impedance components (706). For instance, one or more of fit resistivity component 406, fit inductance component 408, fit primary resonance component 410, and fit secondary resonance component 412 may not output, or fit in embodiments, their respective impedance component portions. That is, the estimated impedance model may be generated using all or less than all of the fitted impedance components described herein. In one embodiment, fit resistivity component 406, fit inductance component 408, fit primary resonance component 410 may respectively fit and output impedance components, and/or associated parameters, for resistivity, inductance, and primary resonance to be used by other described loudspeaker protection system portions, e.g., impedance to excursion model converter 204 of FIG. 2.

Turning now to FIG. 8, a block diagram of an impedance to excursion model converter 800 of an upstream loudspeaker model estimation component of a loudspeaker protection system is shown, according to an embodiment, e.g., of upstream loudspeaker model estimation component 200 of FIG. 2. Impedance to excursion model converter 800 may be a further embodiment of impedance to excursion model converter 204 of FIG. 2. Impedance to excursion model converter 800 includes a resistivity selector 802, an inductance selector 804, a primary resonance selector 806, and a secondary resonance selector 808, which may be grouped as a single component in embodiments: a continuous time component/parameter selector 834. Impedance to excursion model converter 800 also includes a bi-linear transform component 810 and a combiner 832.

Referring also to FIG. 9, a flowchart 900 for impedance to excursion model conversion by the impedance to excursion model converter of FIG. 8 is shown, according to an embodiment. Upstream loudspeaker model estimation component 200 of FIG. 2, along with its subcomponents such as impedance to excursion model converter 204, and impedance to excursion model converter 800 of FIG. 8, along with its subcomponents, may be configured to perform their respective functions in accordance with flowchart 900. Flowchart 900 is described as follows.

The fitted plurality of estimated impedance components that comprise the estimated impedance model from the impedance model fitter are received (902). For example, the fitted plurality of estimated impedance components fitted by impedance model fitter 400 of FIG. 4, described above, are received by impedance to excursion model converter 800. Resistivity selector 802 is configured to receive the fitted, estimated resistivity component of the estimated impedance model via a connector 812 that may correspond to connector 426 of FIG. 4. Inductance selector 804 is configured to receive the fitted, estimated inductance component of the estimated impedance model via a connector 814 that may correspond to connector 428 of FIG. 4. Primary resonance selector 806 is configured to receive the fitted, estimated primary resonance component of the estimated impedance model via a connector 816 that may correspond to connector 430 of FIG. 4, or to connector 434 if lumped parameters are calculated as described above. Secondary resonance selector 808 is configured to receive the fitted, estimated secondary resonance component of the estimated impedance model via a connector 818 that may correspond to connector 432 of FIG. 4, or to connector 436 if lumped parameters are calculated as described above.

Resistivity selector 802, inductance selector 804, primary resonance selector 806, and secondary resonance selector 808 may be configured to select or deselect their respective, received fitted impedance model components, or parameters thereof, according to embodiments. Selected components are provided to bi-linear transform component 810 via a connector 828, subsequent to being combined and used to generate the continuous time transfer function (as in Equation 5) by combiner 832, via a connector 820 for resistivity selector 802, via a connector 822 for inductance selector 804, via a connector 824 for primary resonance selector 806, and via a connector 826 for secondary resonance selector 808.

It should be noted, however, that combiner 832, or portions thereof, may reside within either of bi-linear transform component 810 or continuous time component/parameter selector 834, or at the output side of bi-linear transform component 810, in embodiments, or that combiner 832 may be optional and the received fitted impedance model components, and/or parameters thereof, may be provided to bi-linear transform component 810 via the respective connectors of the selector components described above in embodiments (connectors not shown for brevity and illustrative clarity). In some embodiments, one or more of resistivity selector 802, inductance selector 804, primary resonance selector 806, and secondary resonance selector 808 may be optional or not included. In such configurations, corresponding ones of connector 812, connector 814, connector 816, and connector 818 may provide corresponding fitted, estimated impedance components, and/or parameters thereof, to combiner 832 or to bi-linear transform component 810.

The resulting estimated impedance model is converted to an excursion model of the loudspeaker (904). For instance, bi-linear transform component 810 is configured to transform a continuous time transfer function to discrete time to generate the loudspeaker excursion model, as described below. The excursion model corresponding to the impedance model may be calculated from the expression of the voice coil voltage to cone excursion transfer function given by Equation 5 which is reproduced here:

$$\frac{X(s)}{U(s)} = \frac{1}{\phi s} \frac{Z_3(s) + Z_6(s)}{Z_1(s) + Z_2(s) + Z_3(s) + Z_6(s)}. \tag{Eq. 5}$$

According to embodiments, combiner 832 is configured to generate the continuous time voice coil voltage to cone excursion transfer function represented in Equation 5 based on the corresponding fitted, estimated impedance components, and/or parameters thereof, received via connector 812, connector 814, connector 816, and connector 818. In embodiments, the combining functions and the generating functions of combiner 832 may be performed by separate components, or by a single component as illustrated in FIG. 8.

In embodiments where all components of the fitted, estimated impedance model are present and utilized (i.e., resistivity, inductance, primary resonance, and secondary resonance), the excursion transfer function becomes:

$$\begin{aligned}\frac{X(s)}{U(s)} &= \frac{1}{\phi s}\frac{\dfrac{s}{C_3 s^2+\dfrac{1}{R_3}s+\dfrac{1}{L_3}}+\dfrac{s}{C_6 s^2+\dfrac{1}{R_6}s+\dfrac{1}{L_6}}}{R+sL+\dfrac{s}{C_3 s^2+\dfrac{1}{R_3}s+\dfrac{1}{L_3}}+\dfrac{s}{C_6 s^2+\dfrac{1}{R_6}s+\dfrac{1}{L_6}}}, \\ &= \frac{1}{\phi s}\frac{\dfrac{sL_3 R_3}{L_3 R_3 C_3 s^2+L_3 s+R_3}+\dfrac{sL_6 R_6}{L_6 R_6 C_6 s^2+L_6 s+R_6}}{R+sL+\dfrac{sL_3 R_3}{L_3 R_3 C_3 s^2+L_3 s+R_3}+\dfrac{sL_6 R_6}{L_3 R_3 C_3 s^2+L_3 s+R_3}} \\ &= \frac{1}{\phi}\left(\frac{L_3 R_3(L_6 R_6 C_6 s^2+L_6 s+R_6)+L_6 R_6(L_3 R_3 C_3 s^2+L_3 s+R_3)}{\begin{array}{l}(R+sL)(L_3 R_3 C_3 s^2+L_3 s+R_3)(L_6 R_6 C_6 s^2+L_6 s+R_6)+\\ sL_3 R_3(L_6 R_6 C_6 s^2+L_6 s+R_6)\ldots+sL_6 R_6(L_3 R_3 C_3 s^2+L_3 s+R_3)\end{array}}\right) \\ &= \frac{b_{s,0}s^2+b_{s,1}s+b_{s,2}}{a_{s,0}s^5+a_{s,1}s^4+a_{s,2}s^3+a_{s,3}s^2+a_{s,4}s+a_{s,5}},\end{aligned} \qquad \text{(Eq. 42)}$$

where $$b_{s,0} = \frac{1}{\phi}L_3 R_3 L_6 R_6 (C_3+C_6), \qquad \text{(Eq. 43)}$$

$$b_{s,1} = \frac{1}{\phi}L_3 L_6(R_3+R_6),$$

$$b_{s,2} = \frac{1}{\phi}R_3 R_6(L_3+L_6),$$

$a_{s,0} = LL_3 R_3 C_3 L_6 R_6 C_6,$ $a_{s,1} = LL_3 R_3 C_3 L_6 + LL_3 L_6 R_6 C_6 + RL_3 R_3 C_3 L_6 R_6 C_6,$ $a_{s,2} = LL_3 R_3 C_3 R_6 + LL_3 L_6 + LR_3 L_6 R_6 C_6 + RL_3 R_3 C_3 L_6 + RL_3 L_6 R_6 C_6 + L_3 R_3 L_6 R_6 C_6 + L_6 R_6 L_3 R_3 C_3,$ $a_{s,3} = LL_3 R_6 + LR_3 L_6 + RL_3 R_3 C_3 R_6 + RR_3 L_6 R_6 C_6 + L_3 R_3 L_6 + L_6 R_6 L_3,$ $a_{s,4} = LR_3 R_6 + RL_3 R_6 + RR_3 L_6 + L_3 R_3 R_6 + L_6 R_6 R_3,$ and $a_{s,5} = RR_3 R_6.$ Referring also to FIG. 10, a flowchart 1000 for impedance to excursion model conversion by the impedance to excursion model converter of FIG. 8 is shown, according to an embodiment. Upstream loudspeaker model estimation component 200 of FIG. 2, along with its subcomponents such as impedance to excursion model converter 204, and impedance to excursion model converter 800 of FIG. 8, along with its subcomponents such as bi-linear transform component 810, may be configured to perform their respective functions in accordance with flowchart 1000. Flowchart 1000 is described as follows.

The continuous time transfer function is transformed to a discrete time transfer function to generate the excursion model (1002). For example, bi-linear transform component 810 is configured to transform the continuous time transfer function to discrete time to generate the excursion model.

The bi-linear transform, $$S = \frac{z-1}{z+1}\frac{2}{T}, \qquad \text{(Eq. 44)}$$

is applied to the continuous time transfer function represented in Equations 5, 42, and 43, to find a corresponding discrete time transfer function as in (1002) above:

$$\frac{X(z)}{U(z)} = \frac{b_{s,0}\left(\frac{z-12}{z+1T}\right)^2 + b_{s,1}\left(\frac{z-12}{z+1T}\right) + b_{s,2}}{a_{s,0}\left(\frac{z-12}{z+1T}\right)^5 + a_{s,1}\left(\frac{z-12}{z+1T}\right)^4 + a_{s,2}\left(\frac{z-12}{z+1T}\right)^3 + a_{s,3}\left(\frac{z-12}{z+1T}\right)^2 + a_{s,4}\left(\frac{z-12}{z+1T}\right) + a_{s,5}},$$ (Eq. 45)

$$= \frac{\left(\frac{T}{2}\right)^3 b_{s,0}(z-1)^2(z+1)^3 + \left(\frac{T}{2}\right)^4 b_{s,1}(z-1)(z+1)^4 + \left(\frac{T}{2}\right)^5 b_{s,2}(z+1)^5}{\begin{pmatrix} a_{s,0}(z-1)^5 + \left(\frac{T}{2}\right)a_{s,1}(z-1)^4(z+1) + \left(\frac{T}{2}\right)^2 a_{s,2}(z-1)^3(z+1)^2 \ldots + \\ \left(\frac{T}{2}\right)^3 a_{s,3}(z-1)^2(z+1)^3 + \left(\frac{T}{2}\right)^4 a_{s,4}(z-1)(z+1)^4 + \left(\frac{T}{2}\right)^5 a_{s,5}(z+1)^5 \end{pmatrix}}$$

$$= \frac{(1+z^{-1})^3(b_0 + b_1 z^{-1} + b_2 z^{-2})}{1 + a_1 z^{-1} + a_2 z^{-2} + a_3 z^{-3} + a_4 z^{-4} + a_5 z^{-5}},$$ (Eq. 46)

where $$b_0 = \frac{\left(\frac{T}{2}\right)^3 b_{s,0} + \left(\frac{T}{2}\right)^4 b_{s,1} + \left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$b_1 = \frac{-2\left(\frac{T}{2}\right)^3 b_{s,0} + 2\left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$b_2 = \frac{\left(\frac{T}{2}\right)^3 b_{s,0} - \left(\frac{T}{2}\right)^4 b_{s,1} + \left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_1 = \frac{-5a_{s,0} - 3\left(\frac{T}{2}\right)a_{s,1} - \left(\frac{T}{2}\right)^2 a_{s,2} + \left(\frac{T}{2}\right)^3 a_{s,3} + 3\left(\frac{T}{2}\right)^4 a_{s,4} + 5\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_2 = \frac{10a_{s,0} + 2\left(\frac{T}{2}\right)a_{s,1} - 2\left(\frac{T}{2}\right)^2 a_{s,2} - 2\left(\frac{T}{2}\right)^3 a_{s,3} + 2\left(\frac{T}{2}\right)^4 a_{s,4} + 10\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_3 = \frac{-10a_{s,0} + 2\left(\frac{T}{2}\right)a_{s,1} + 2\left(\frac{T}{2}\right)^2 a_{s,2} - 2\left(\frac{T}{2}\right)^3 a_{s,3} - 2\left(\frac{T}{2}\right)^4 a_{s,4} + 10\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_4 = \frac{5a_{s,0} - 3\left(\frac{T}{2}\right)a_{s,1} + \left(\frac{T}{2}\right)^2 a_{s,2} + \left(\frac{T}{2}\right)^3 a_{s,3} - 3\left(\frac{T}{2}\right)^4 a_{s,4} + 5\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}}, \text{ and}$$

$$a_5 = \frac{-a_{s,0} + \left(\frac{T}{2}\right)a_{s,1} - \left(\frac{T}{2}\right)^2 a_{s,2} + \left(\frac{T}{2}\right)^3 a_{s,3} - \left(\frac{T}{2}\right)^4 a_{s,4} + \left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}}.$$

Given the embodiments described herein for which less than all of the impedance components of the estimated impedance model may be utilized or present in the model, e.g., as described above with respect to FIGS. 4, 8 and 9, it is contemplated in this disclosure that such estimated impedance models may be converted to excursion models using combiner 832 and simplified transforms by bi-linear transform component 810.

Referring to FIG. 11, a flowchart 1100 for impedance to excursion model conversion by the impedance to excursion model converter of FIG. 8 is shown, according to an embodiment. Upstream loudspeaker model estimation component 200 of FIG. 2, along with its subcomponents such as impedance to excursion model converter 204, and impedance to excursion model converter 800 of FIG. 8, along with its subcomponents such as bi-linear transform component 810 and combiner 832, may be configured to perform their respective functions in accordance with flowchart 1100. Flowchart 1100 is described as follows.

A portion the resulting estimated impedance model is converted to an excursion model of the loudspeaker (1102). For example, it is contemplated herein that zero, one, or more components of the fitted, estimated impedance model are not present and are not utilized (i.e., zero, one, or more of resistivity, inductance, primary resonance, and secondary resonance) in the generation of the excursion model (i.e., the continuous time voice coil voltage to cone excursion transfer function represented in Equation 5) by combiner 832 and in the transformation of the continuous time transfer function to discrete time by bi-linear transform component 810 to generate the loudspeaker excursion model by bi-linear transform component 810.

In the case of a negligible or absent secondary resonance component, the excursion transfer function simplifies to:

$$\frac{X(s)}{U(s)} = \frac{1}{\phi s}\frac{Z_3(s)}{Z_1(s) + Z_2(s) + Z_3(s)} \quad \text{(Eq. 47)}$$

$$= \frac{1}{\phi s}\frac{\dfrac{s}{C_3 s^2 + \dfrac{1}{R_3}s + \dfrac{1}{L_3}}}{R + sL + \dfrac{s}{C_3 s^2 + \dfrac{1}{R_3}s + \dfrac{1}{L_3}}}$$

$$= \frac{1}{\phi}\frac{L_3 R_3}{(R + sL)(L_3 R_3 C_3 s^2 + L_3 s + R_3) + sL_3 R_3}$$

$$= \frac{b_{s,0}}{a_{s,0}s^3 + a_{s,1}s^2 + a_{s,2}s + a_{s,3}}, \quad \text{(Eq. 48)}$$

where $b_{s,0} = \dfrac{1}{\phi}L_3 R_3,$ $a_{s,0} = LL_3 R_3 C_3,$ $a_{s,1} = LL_3 + RL_3 R_3 C_3,$ $a_{s,2} = LR_3 + RL_3 + L_3 R_3,$ and $a_{s,3} = RR_3.$ The bi-linear transform given in Equation 44 is applied to the continuous time transfer function represented in Equations 5, 47, and 48, to find a corresponding discrete time transfer function as in (1002) above:

$$\frac{X(z)}{U(z)} = \frac{b_{s,0}}{a_{s,0}\left(\dfrac{z-12}{z+1T}\right)^3 + a_{s,1}\left(\dfrac{z-12}{z+1T}\right)^2 + a_{s,2}\left(\dfrac{z-12}{z+1T}\right) + a_{s,3}} \quad \text{(Eq. 49)}$$

$$= \frac{\left(\dfrac{T}{2}\right)^3 b_{s,0}(z+1)^3}{a_{s,0}(z-1)^3 + \left(\dfrac{T}{2}\right)a_{s,1}(z-1)^2(z+1) + \left(\dfrac{T}{2}\right)^3 a_{s,2}(z+1)^2(z-1) + \left(\dfrac{T}{2}\right)^3 a_{s,3}(z+1)^3}$$

$$= \frac{b_0(1+z^{-1})^3}{1 + a_1 z^{-1} + a_2 z^{-2} + a_3 z^{-3}}, \quad \text{(Eq. 50)}$$

where $$b_0 = \frac{\left(\dfrac{T}{2}\right)^3 b_{s,0}}{a_{s,0} + \left(\dfrac{T}{2}\right)a_{s,1} + \left(\dfrac{T}{2}\right)^2 a_{s,2} + \left(\dfrac{T}{2}\right)^3 a_{s,3}},$$

$$a_1 = \frac{-3a_{s,0} - \left(\dfrac{T}{2}\right)a_{s,1} + \left(\dfrac{T}{2}\right)^2 a_{s,2} + 3\left(\dfrac{T}{2}\right)^3 a_{s,3}}{a_{s,0} + \left(\dfrac{T}{2}\right)a_{s,1} + \left(\dfrac{T}{2}\right)^2 a_{s,2} + \left(\dfrac{T}{2}\right)^3 a_{s,3}},$$

$$a_2 = \frac{3a_{s,0} - \left(\dfrac{T}{2}\right)a_{s,1} - \left(\dfrac{T}{2}\right)^2 a_{s,2} + 3\left(\dfrac{T}{2}\right)^3 a_{s,3}}{a_{s,0} + \left(\dfrac{T}{2}\right)a_{s,1} + \left(\dfrac{T}{2}\right)^2 a_{s,2} + \left(\dfrac{T}{2}\right)^3 a_{s,3}}, \text{ and}$$

$$a_3 = \frac{-a_{s,0} + \left(\dfrac{T}{2}\right)a_{s,1} - \left(\dfrac{T}{2}\right)^2 a_{s,2} + \left(\dfrac{T}{2}\right)^3 a_{s,3}}{a_{s,0} + \left(\dfrac{T}{2}\right)a_{s,1} + \left(\dfrac{T}{2}\right)^2 a_{s,2} + \left(\dfrac{T}{2}\right)^3 a_{s,3}}.$$

Accordingly, bi-linear transform component 810 is configured to transform the continuous time transfer function to discrete time to generate the loudspeaker excursion model with a negligible or omitted secondary resonance component, but with the presence of resistive, inductive, and primary resonance components.

In the case of a negligible or omitted voice coil inductance component, but presence of a secondary resonance component, the excursion transfer function becomes:

(Eq. 51)

$$\frac{X(s)}{U(s)} = \frac{1}{\phi s}\frac{Z_3(s) + Z_6(s)}{Z_1(s) + Z_3(s) + Z_6(s)}$$

$$= \frac{1}{\phi s}\frac{\dfrac{s}{C_3 s^2 + \dfrac{1}{R_3}s + \dfrac{1}{L_3}} + \dfrac{s}{C_6 s^2 + \dfrac{1}{R_6}s + \dfrac{1}{L_6}}}{R + \dfrac{s}{C_3 s^2 + \dfrac{1}{R_3}s + \dfrac{1}{L_3}} + \dfrac{s}{C_6 s^2 + \dfrac{1}{R_6}s + \dfrac{1}{L_6}}}$$

$$= \frac{1}{\phi s}\frac{\dfrac{sL_3 R_3}{L_3 R_3 C_3 s^2 + L_3 s + R_3} + \dfrac{sL_6 R_6}{L_6 R_6 C_6 s^2 + L_6 s + R_6}}{R + \dfrac{sL_3 R_3}{L_3 R_3 C_3 s^2 + L_3 s + R_3} + \dfrac{sL_6 R_6}{L_6 R_6 C_6 s^2 + L_6 s + R_6}}$$

$$= \frac{1}{\phi}\frac{L_3 R_3(L_6 R_6 C_6 s^2 + L_6 s + R_6) + L_6 R_6(L_3 R_3 C_3 s^2 + L_3 s + R_3)}{R(L_3 R_3 C_3 s^2 + L_3 s + R_3)(L_6 R_6 C_6 s^2 + L_6 s + R_6) \ldots +}$$

$$sL_3 R_3(L_6 R_6 C_6 s^2 + L_6 s + R_6) + sL_6 R_6(L_3 R_3 C_3 s^2 + L_3 s + R_3)$$

$$= \frac{b_{s,0}s^2 + b_{s,1}s + b_{s,2}}{a_{s,0}s^4 + a_{s,1}s^3 + a_{s,2}s^2 + a_{s,3}s + a_{s,4}}, \quad \text{(Eq. 52)}$$

where $$b_{s,0} = \frac{1}{\phi} L_3 R_3 L_6 R_3 (C_3 + C_6),$$

$$b_{s,1} = \frac{1}{\phi} L_3 L_6 (R_3 + R_6),$$

$$b_{s,2} = \frac{1}{\phi} R_3 R_6 (L_3 + L_6),$$

$$a_{s,0} = R L_3 R_3 C_3 L_6 R_6 C_6,$$

$$a_{s,1} = R L_3 R_3 C_3 L_6 + R L_3 L_6 R_6 C_6 + L_3 R_3 L_6 R_6 C_6 + L_6 R_6 L_3 R_3 C_3,$$

$$a_{s,2} = R L_3 R_3 C_3 R_6 + R R_3 L_6 R_6 C_6 + L_3 R_3 L_6 + L_6 R_6 L_3,$$

$$a_{s,3} = R L_3 R_6 + R R_3 L_6 + L_3 R_3 R_6 + L_6 R_6 R_3, \text{ and}$$

$$a_{s,4} = R R_3 R_6.$$

The bi-linear transform given in Equation 44 is applied to the continuous time transfer function represented in Equations 5, 51, and 52, to find a corresponding discrete time transfer function as in (1002) above:

$$\frac{X(z)}{U(z)} = \frac{b_{s,0}\left(\frac{z-1}{z+1}\frac{2}{T}\right)^2 + b_{s,1}\left(\frac{z-1}{z+1}\frac{2}{T}\right) + b_{s,2}}{a_{s,0}\left(\frac{z-1}{z+1}\frac{2}{T}\right)^4 + a_{s,1}\left(\frac{z-1}{z+1}\frac{2}{T}\right)^3 + a_{s,2}\left(\frac{z-1}{z+1}\frac{2}{T}\right)^2 + a_{s,3}\left(\frac{z-1}{z+1}\frac{2}{T}\right) + a_{s,4}} \quad \text{(Eq. 53)}$$

$$= \frac{\left(\frac{T}{2}\right)^2 b_{s,0}(z-1)^2(z+1)^2 + \left(\frac{T}{2}\right)^3 b_{s,1}(z-1)(z+1)^3 + \left(\frac{T}{2}\right)^4 b_{s,2}(z+1)^4}{a_{s,0}(z-1)^4 + \left(\frac{T}{2}\right)a_{s,1}(z-1)^3(z+1) + \left(\frac{T}{2}\right)^2 a_{s,2}(z-1)^2(z+1)^2 \ldots + \left(\frac{T}{2}\right)^3 a_{s,3}(z-1)(z+1)^3 + \left(\frac{T}{2}\right)^4 a_{s,4}(z-1)(z+1)^4}$$

$$= \frac{(1+z^{-1})^2(b_0 + b_1 z^{-1} + b_2 z^{-2})}{1 + a_1 z^{-1} + a_2 z^{-2} + a_3 z^{-3} + a_4 z^{-4}}, \quad \text{(Eq. 54)}$$

where $$b_0 = \frac{\left(\frac{T}{2}\right)^2 b_{s,0} + \left(\frac{T}{2}\right)^3 b_{s,1} + \left(\frac{T}{2}\right)^4 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$b_1 = \frac{-2\left(\frac{T}{2}\right)^2 b_{s,0} + 2\left(\frac{T}{2}\right)^4 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$b_2 = \frac{\left(\frac{T}{2}\right)^2 b_{s,0} - \left(\frac{T}{2}\right)^3 b_{s,1} + \left(\frac{T}{2}\right)^4 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$a_1 = \frac{-4a_{s,0} - 2\left(\frac{T}{2}\right)a_{s,1} + 2\left(\frac{T}{2}\right)^3 a_{s,3} + 4\left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$a_2 = \frac{6a_{s,0} - 2\left(\frac{T}{2}\right)^2 a_{s,2} + 6\left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

-continued $$a_3 = \frac{-4a_{s,0} + 2\left(\frac{T}{2}\right)a_{s,1} - 2\left(\frac{T}{2}\right)^3 a_{s,3} + 4\left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}}, \text{ and}$$

$$a_4 = \frac{a_{s,0} - \left(\frac{T}{2}\right)a_{s,1} + \left(\frac{T}{2}\right)^2 a_{s,2} - \left(\frac{T}{2}\right)^3 a_{s,3} + \left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}}.$$

Accordingly, bi-linear transform component 810 is configured to transform the continuous time transfer function to discrete time to generate the loudspeaker excursion model with a negligible or omitted voice coil inductance component, but with the presence of a secondary resonance component as well as resistive and inductive components.

If the voice coil inductance negligible or absent, and the secondary resonance is negligible or absent, the excursion transfer function simplifies to:

$$\frac{X(s)}{U(s)} = \frac{1}{\phi s} \frac{Z_3(s)}{Z_1(s) + Z_3(s)} \quad \text{(Eq. 55)}$$

$$= \frac{1}{\phi s} \frac{\frac{s}{C_3 s^2 + \frac{1}{R_3}s + \frac{1}{L_3}}}{R + \frac{s}{C_3 s^2 + \frac{1}{R_3}s + \frac{1}{L_3}}}$$

$$= \frac{1}{\phi} \frac{L_3 R_3}{R(L_3 R_3 C_3 s^2 + L_3 s + R_3) + s L_3 R_3}$$

$$= \frac{b_{s,0}}{a_{s,0} s^2 + a_{s,1} s + a_{s,2}}, \quad \text{(Eq. 56)}$$

where $b_{s,0} = \frac{1}{\phi} L_3 R_3,$ $a_{s,0} = R L_3 R_3 C_3,$ $a_{s,1} = R L_3 + L_3 R_3,$ and $a_{s,2} = R R_3.$ The bi-linear transform given in Equation 44 is applied to the continuous time transfer function represented in Equations 5, 55, and 56, to find a corresponding discrete time transfer function as in (1002) above:

(Eq. 57)

$$\frac{X(z)}{U(z)} = \frac{b_{s,0}}{a_{s,0}\left(\frac{z-12}{z+1T}\right)^2 + a_{s,1}\left(\frac{z-12}{z+1T}\right) + a_{s,2}}$$

$$= \frac{\left(\frac{T}{2}\right)^2 b_{s,0}(z+1)^2}{a_{s,0}(z-1)^2 + \left(\frac{T}{2}\right)a_{s,1}(z-1)(z+1) + \left(\frac{T}{2}\right)^2 a_{s,2}(z+1)^2}$$

$$= \frac{b_0(1+z^{-1})^2}{1 + a_1 z^{-1} + a_2 z^{-2}}, \quad \text{(Eq. 58)}$$

where

-continued $$b_0 = \frac{\left(\frac{T}{2}\right)^2 b_{s,0}}{a_{s,0} + \left(\frac{T}{2}\right)a_{s,1} + \left(\frac{T}{2}\right)^2 a_{s,2}},$$

$$a_1 = \frac{-2a_{s,0} + 2\left(\frac{T}{2}\right)^2 a_{s,2}}{a_{s,0} + \left(\frac{T}{2}\right)a_{s,1} + \left(\frac{T}{2}\right)^2 a_{s,2}}, \text{ and}$$

$$a_2 = \frac{a_{s,0} - \left(\frac{T}{2}\right)a_{s,1} + \left(\frac{T}{2}\right)^2 a_{s,2}}{a_{s,0} + \left(\frac{T}{2}\right)a_{s,1} + \left(\frac{T}{2}\right)^2 a_{s,2}}.$$

Accordingly, bi-linear transform component 810 is configured to transform the continuous time transfer function to discrete time to generate the loudspeaker excursion model with a negligible or omitted voice coil inductance component and with a negligible or omitted secondary resonance component, but including resistive and primary resonance components.

With the simplest possible modeling, and only including the voice coil resistivity component, the excursion transfer function simplifies to:

$$\frac{X(s)}{U(s)} = \frac{1}{\phi s} \frac{1}{z_1(s)}, \quad \text{(Eq. 59)}$$

$$= \frac{1}{\phi R s}. \quad \text{(Eq. 60)}$$

This model is relevant for completeness, and for supporting experimental changes to the inclusion of various sub-components of the impedance.

Again, the bi-linear transform given in Equation 44 is applied to the continuous time transfer function represented in Equations 5, 59, and 60, to find a corresponding discrete time transfer function as in (1002) above:

$$\frac{X(z)}{U(z)} = \frac{1}{\phi R\left(\frac{z-12}{z+1T}\right)} = \frac{\left(\frac{T}{2}\right)\frac{1}{\phi R}(1+z^{-1})}{1-z^{-1}} = \frac{b_0(1+z^{-1})}{1+a_1 z^{-1}}, \quad \text{(Eq. 61)}$$

where $b_0 = \left(\frac{T}{2}\right)\frac{1}{\phi R},$ and $a_1 = -1.$

Accordingly, bi-linear transform component 810 is configured to transform the continuous time transfer function to discrete time to generate the loudspeaker excursion model with only a resistive component included in some embodiments.

Similarly to the scenario including only the resistivity component above, the following scenario with only the voice coil resistivity and inductance components being modeled is relevant for completeness and experimental purposes in order to allow arbitrary configuration of sub-impedances being modeled. With only the voice coil resistivity and inductance components being modeled, the excursion transfer function simplifies to $$\frac{X(s)}{U(s)} = \frac{1}{\phi s} \frac{1}{Z_1(s) + Z_2(s)} = \frac{1}{\phi s(R + Ls)} = \frac{1}{\phi Ls^2 + \phi Rs} = \frac{1}{a_{s,0}s^2 + a_{s,1}s}, \quad \text{(Eq. 62)}$$

where $\alpha_{s,0} = \phi L$, and
$\alpha_{s,1} = \phi R$.

The bi-linear transform given in Equation 44 is applied to the continuous time transfer function represented in Equations 5 and 62 to find a corresponding discrete time transfer function as in (1002) above:

$$\frac{X(s)}{U(s)} = \frac{1}{a_{s,0}\left(\frac{z-12}{z+1T}\right)^2 + a_{s,1}\left(\frac{z-12}{z+1T}\right)} \quad \text{(Eq. 63)}$$

$$= \frac{\left(\frac{T}{2}\right)^2 (z+1)^2}{a_{s,0}(z-1)^2 + \left(\frac{T}{2}\right)a_{s,1}(z-1)(z+1)}$$

$$= \frac{b_0(1+z^{-1})^2}{1 + a_1 z^{-1} + a_2 z^{-2}}, \quad \text{(Eq. 64)}$$

where $$b_0 = \frac{\left(\frac{T}{2}\right)^2}{a_{s,0} + \left(\frac{T}{2}\right)a_{s,1}},$$

$$a_1 = \frac{-2a_{s,0}}{a_{s,0} + \left(\frac{T}{2}\right)a_{s,1}}, \text{ and}$$

$$a_2 = \frac{a_{s,0} - \left(\frac{T}{2}\right)a_{s,1}}{a_{s,0} + \left(\frac{T}{2}\right)a_{s,1}}.$$

Accordingly, bi-linear transform component 810 is configured to transform the continuous time transfer function to discrete time to generate the loudspeaker excursion model with only resistive and inductance components included in some embodiments.

Figure 12:
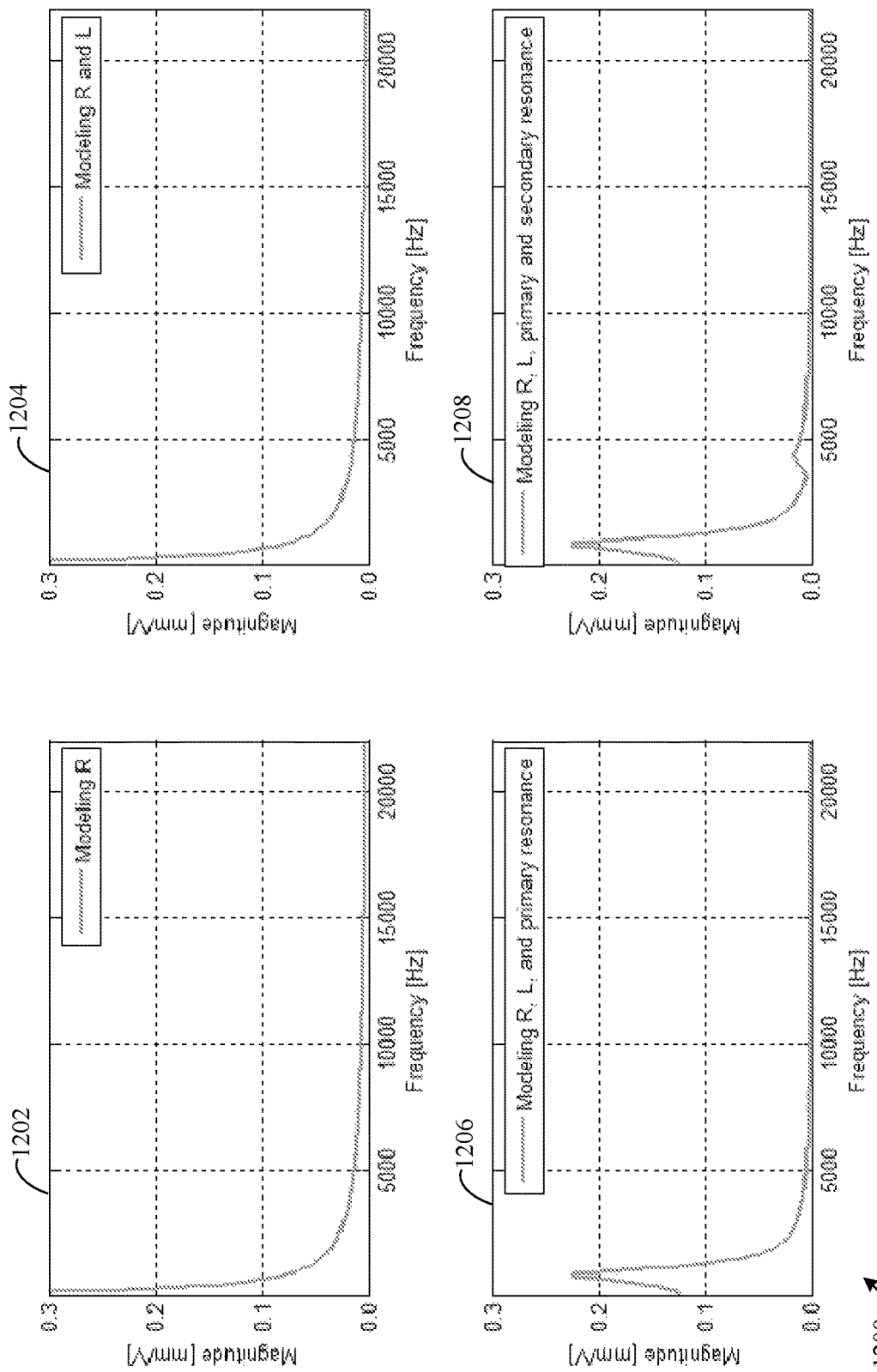
FIG. 12 shows excursion model transfer functions, according to an example embodiment.

FIG. 12 shows excursion model transfer functions 1200, according to an embodiment. As illustrated, each transfer function is represented with respect to an x-axis in Hz (frequency) and a y-axis in mm/V (magnitude of loudspeaker excursion). Excursion model transfer functions 1200 include a first transfer function 1202, a second transfer function 1204, a third transfer function 1206, and a fourth transfer function 1208.

First transfer function 1202 corresponds to an excursion model transfer function in which only the resistivity component of the impedance is used, as in an example above. Second transfer function 1204 corresponds to an excursion model transfer function in which only the resistivity and inductance components of the impedance are used, as in an example above. Third transfer function 1206 corresponds to an excursion model transfer function in which the resistivity, inductance, and primary resonance components of the impedance are used, as in an example above. Fourth transfer function 1208 corresponds to an excursion model transfer function in which the resistivity, inductance, primary resonance, and secondary resonance components of the impedance are used, as in an example above.

The converted excursion model, and/or parameters thereof, may be provided to other portions of the loudspeaker protection system, e.g., to downstream audio signal processing component 102 of FIG. 1, or to excursion-constraining processing circuitry 1410 described in further detail below, via a connector 830 which may correspond to connector 216 of FIG. 2, in embodiments.

It should also be noted that in embodiments bi-linear transform component 810 may be replaced with a component that, along with combiner 832 as described herein, converts the estimated impedance model to an excursion model using another type of transform (i.e., other known transforms to convert from a continuous time to discrete time transfer function). In some embodiments, the excursion model comprises a continuous time transfer function. That is, bi-linear transform component 810 is an exemplary implementation for one possible configuration according to embodiments.

Figure 13:
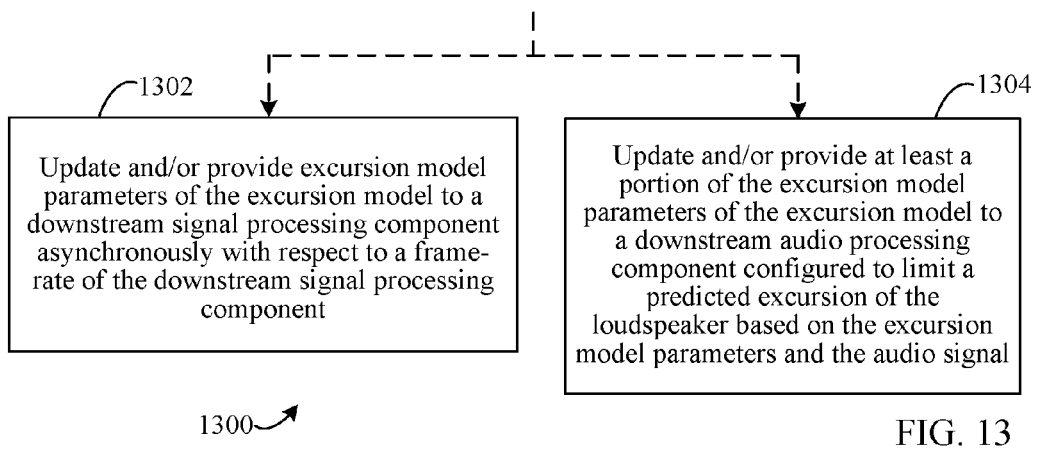
FIG. 13 shows a flowchart for impedance to excursion model conversion by the impedance to excursion model converter of FIG. 8, according to an example embodiment.

Turning now to FIG. 13, a flowchart 1300 for providing excursion model updates is shown, according to an embodiment. Upstream loudspeaker model estimation component 200 of FIG. 2, and impedance to excursion model converter 800 of FIG. 8, along with their respective subcomponents, may be configured to perform their respective functions in accordance with flowchart 1300. Flowchart portions 1302 and/or 1304 may be optional in embodiments, and may be performed separately, alternatively, or together. In embodiments, flowchart 1300 may be performed subsequent to flowcharts 900, 1000, and/or 1100. Flowchart 1300 is described as follows.

Excursion model parameters of the excursion model are updated and/or provided to a downstream signal processing component asynchronously with respect to a frame-rate of the downstream signal processing component (1302). For example, impedance to excursion model converter 800 may be configured to update an excursion model and/or parameters thereof, as described herein, via connector 830, and such updates may be performed asynchronously with respect to a downstream processing component, e.g., downstream audio signal processing component 102 of FIG. 1A or downstream audio signal processing component 1400 of FIG. 14 described below, or respective subcomponents thereof. Additionally, impedance to excursion model converter 800 a may be configured to provide the excursion model and/or parameters to a downstream processing component, or its subcomponents, as described herein, and such provision may be performed asynchronously with respect to the downstream processing component, or its subcomponents. That is, any subcomponents of upstream loudspeaker model estimation component 200, impedance model fitter 400, and/or impedance to excursion model converter 800, may be configured to perform their respective functions in an asynchronous manner with respect to downstream processing components.

At least a portion of the excursion model parameters of the excursion model are updated and/or provided to a downstream audio processing component configured to limit a predicted excursion of the loudspeaker based on the excursion model parameters and the audio signal (1304). For example, impedance to excursion model converter 800 may be configured to update and/or provide an excursion model and/or its parameters, as described herein, via connector 830, and such updates may be provided to a downstream audio signal processing component or its subcomponents to limit predicted loudspeaker excursions.

III. Example Downstream Processing Embodiments

As noted above, systems for protection of loudspeakers, such as microspeakers, along with their components such as downstream processing components, may be configured in various ways to provide loudspeaker protection.

In embodiments, by way of illustrative example and not limitation, a downstream audio signal processing component comprises one or more subcomponents configured to constrain the temperature of a loudspeaker (or voice coil thereof) during operation, constrain an excursion of the loudspeaker, and suppress distortion of an audio signal to be played back by the loudspeaker. These functions of the downstream audio signal processing component may be based, at least in part, on temperature estimations/predictions, gain change parameters, and excursion models, of the loudspeaker during its operation, as described herein.

Figure 14:
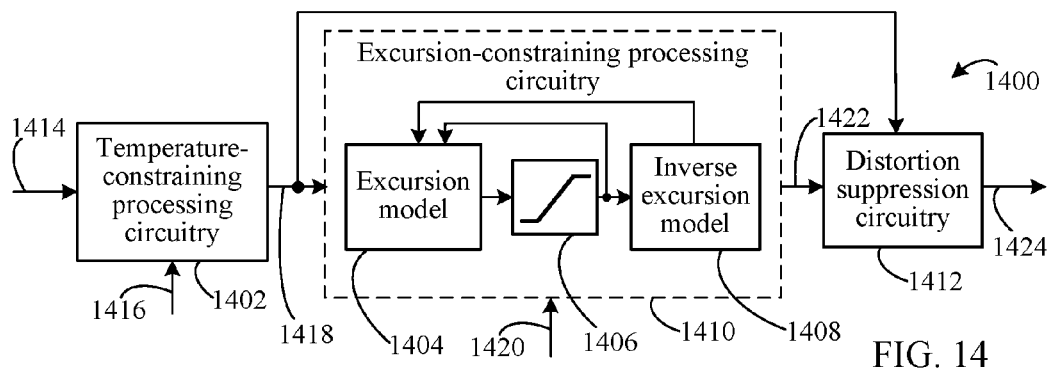
FIG. 14 shows a block diagram of a downstream audio signal processing component of a loudspeaker protection system, according to an example embodiment.

FIG. 14 shows a block diagram of a downstream audio signal processing component 1400 of a loudspeaker protection system, according to an embodiment. Downstream audio signal processing component 1400 may be a further embodiment of downstream audio signal processing component 102 of FIG. 1A. Downstream audio signal processing component 1400 includes a temperature-constraining processing circuitry 1402, excursion model circuitry 1404, a limiter 1406, inverse excursion model circuitry 1408, and distortion suppression circuitry 1412. In embodiments, excursion model circuitry 1404, limiter 1406, inverse excursion model circuitry 1408 may together comprise excursion-constraining processing circuitry 1410.

Audio signals may be received and an excursion model of the loudspeaker may be received from an upstream loudspeaker model estimation component. For instance, excursion-constraining processing circuitry 1410 is configured to receive the excursion model or parameters thereof, e.g., at excursion model circuitry 1404 and inverse excursion model circuitry 1408, from upstream loudspeaker model estimation component 200 of FIG. 2, e.g., from impedance to excursion model converter 204, or from impedance to excursion model converter 800 of FIG. 8, via a connector 1420. In embodiments, parameters of the excursion model may be provided to and received by excursion-constraining processing circuitry 1410.

A predicted diaphragm or cone excursion of the loudspeaker may be limited based on the excursion model by generating a processed version of the audio signal having a voltage corresponding to a constrained excursion. For example, excursion-constraining processing circuitry 1410 is configured to limit a predicted excursion of a cone or diaphragm of a loudspeaker corresponding to an audio signal. In embodiments, excursion-constraining processing circuitry 1410 is configured to limit a predicted excursion of a diaphragm in a loudspeaker, such as loudspeaker 106 of FIG. 1A, according to the generated excursion model described above and received via connector 1420. Excursion-constraining processing circuitry 1410 is configured to limit a predicted excursion of a loudspeaker corresponding to an audio signal according to parameters of the excursion model received via connector 1420, according to embodiments. That is, according to embodiments, the excursion model or parameters thereof may be provided to feed-forward excursion model circuitry 1404 with integral feed-backward inverse excursion model circuitry 1408 and limiter 1406, together comprising a non-linear constraint filter, to limit a predicted excursion of a loudspeaker by generating a processed version of the audio signal having a voltage corresponding to a constrained predicted excursion.

Distortion suppression circuitry 1412 is configured to suppress unwanted distortion in the processed version of the audio signal. Distortion in the processed version of the audio signal is suppressed, thereby generating an output audio signal for playback by the loudspeaker. For instance, distortion suppression circuitry 1412 may receive the processed version of the audio signal from excursion-constraining processing circuitry 1410, via a connector 1422, and suppress distortion, such as unwanted distortion, in the processed version of the audio signal. Distortion suppression circuitry 1412 may also be configured to receive a temperature-constrained audio signal from temperature-constraining processing circuitry 1402 via a connector 1418, as described below, for use in the distortion suppression. In some cases, the processed version of the audio signal may have distortion present due to the processing of the excursion-constraining processing circuitry 1410 to constrain a predicted excursion of a loudspeaker. Distortion suppression circuitry 1412 is configured to suppress this distortion in the processed version of the audio signal based at least on a transform representation, such as a spectral representation, of the processed version of the audio signal, e.g., with frequency resolution such as power- or magnitude-spectra in embodiments. Accordingly, distortion suppression circuitry 1412 is configured to generate an output audio signal for playback by the loudspeaker having suppressed distortion. The output audio signal may be provided for playback by the loudspeaker via a connector 1424.

Constraining loudspeaker voice coil temperature may also be performed by downstream audio signal processing component 1400 of FIG. 14, according to an embodiment. For example, temperature-constraining processing circuitry 1402 is configured to receive an input audio signal via a connector 1414. The input audio signal may be provided by a microphone, a processor, or a memory of a device (e.g., as recorded audio or the like), as described herein. In embodiments, the audio signal is received as a digital audio signal, although receiving analog audio signals is contemplated herein.

The input audio signal is processed according to the gain change parameter that is received from the voice coil temperature modeler to constrain the temperature of the voice coil in a temperature-constrained audio signal. For instance, temperature-constraining processing circuitry 1402 is configured to process an input audio signal that is received via connector 1414 according to the gain change parameter provided by gain estimator 208 of upstream loudspeaker model estimation component 200 or via connector 1416 to reduce the temperature of a loudspeaker or a voice coil thereof. In embodiments, the gain change parameter is applied to the input audio signal to lower the overall effective gain when the temperature of a loudspeaker or voice coil exceeds a determined value or is increasing toward the determined value, as described herein. When the temperature is decreasing, the constraint thereof may be relaxed, and temperature-constraining processing circuitry 1402 may process the input audio signal on connector 1414 using, e.g., a unity gain, or a gain that is higher than the gain change parameter used to constrain the input audio signal.

A temperature-constrained audio signal may be provided to the first audio signal processing component as the audio signal described above. For example, temperature-constraining processing circuitry 1402 is configured to provide the temperature-constrained audio signal to excursion-constraining processing circuitry 1410 via connector 1418. Embodiments may further include providing the temperature-constrained audio signal via connector 1418 to distortion suppression circuitry 1412, as noted above.

IV. Further Example Embodiments and Advantages

As noted above, systems and devices may be configured in various ways to perform methods for loudspeaker protection according to the techniques and embodiments provided. For instance, in embodiments, upstream loudspeaker model estimation components are configured to receive sensed electrical characteristics of a loudspeaker and generate an impedance model from which an excursion model of the loudspeaker and a gain change parameter may be generated. Downstream processing components may subsequently utilize the gain change parameter and the excursion model (or parameters thereof) to constrain the temperature of a voice coil of the loudspeaker and to limit a predicted excursion of the loudspeaker. Downstream processing components may also utilize processed signals associated with the constrained temperature and the limited excursion to suppress distortion for an output audio signal to be played back by the loudspeaker.

According to the described techniques, the gain change parameter and the excursion model, along with its associated parameters, may be updated at any rate, and may be updated independently of audio processing circuitry (i.e., asynchronously). The audio processing circuitry is configured to process audio signals at a rate such that a processed audio frame is provided as output to be played back by a loudspeaker for every audio frame input received. For example, the downstream processing components described herein may process an audio frame approximately every 10 ms (i.e., the frame-rate). However, while the downstream model estimation components may update the gain change parameter and the excursion model (and parameters) at a similar rate, in embodiments the updating for the gain change parameter and the excursion model may be performed at a slower rate than the frame-rate that provides a balance between robust loudspeaker protection, power usage, and system complexity.

Additionally, because the downstream processing components process the audio signals and the upstream loudspeaker model estimation components do not process the audio signals, according to embodiments, the updating rate of the upstream loudspeaker model estimation components is not required to be as fast as the downstream processing components, e.g., for temperature prediction and gain change parameter generation based on a relatively slowly changing temperature for loudspeakers and voice coils in devices. It is contemplated in embodiments, however, that the conversion/generation and updating for excursion models may be performed at a rate that is higher than that for the temperature prediction and gain change parameter, but is less than or equal to the operating rate for processing audio signals by the downstream processing components.

Electrical observations in the form of measurement of the voice coil current and voltage allow for estimation of the electrical counterparts of the mechanical loudspeaker parameters, but does not allow unique estimation of the mechanical loudspeaker parameters. Determining the voice coil voltage to cone excursion transfer function, and hence predicting the cone excursion from the voice coil voltage, requires the mechanical loudspeaker parameters, or at the very least, the force factor in addition to the electrical parameters. Possible approximations of the force factor by using the worst case value (e.g., based on manufacturing tolerance) in terms of reaching highest cone excursion may be applied. Operating such that the worst case cone excursion obeys the maximum cone excursion may provide operation within a safe range, albeit more conservative in general than may be necessary. The possibility of estimating the force factor by an additional measurement(s) (e.g., beyond the voice coil current and voltage) is described below. The challenge is to find a nonintrusive approach as the estimation must be carried out "on the fly" with the real device and without the ability to attach weight to the loudspeaker cone, add an enclosure of known volume, or, due to cost, include a laser or a secondary coil in the loudspeaker design.

The additional measurement mentioned above is a measure of the sound pressure which in comparison to a prediction of the sound pressure may provide a path to estimate the force factor, according to embodiments. There are, however, practical issues to overcome, e.g., that the sound pressure is affected by the environment such as a room and a practical way to measure the sound pressure must be devised. The effect of the environment can be minimized by measuring the sound pressure close to the loudspeaker so that the direct path dominates any reflections, and measurement of the sound pressure can be carried out by exploiting the microphone likely already present on a device. This may require compensation for any transfer functions due to the acoustic design of the device, which however, is fixed and hence can be known from the design of the device.

With the assumption of a small device (e.g., without limitation, a mobile or smart phone with a loudspeaker or microspeaker), the sounds pressure in the far field can be predicted as:

$$p_d(t) = \frac{\partial^2 x(t)}{\partial t^2} \frac{\rho_0 S_d}{4\pi d}, \quad \text{(Eq. 65)}$$

where $\rho_0$ is density of air under adiabatic conditions (~1.21 kg/m$^3$), $S_d$ is effective radiation (cone) area, and d is distance from the loudspeaker to the observation point of sound pressure.

Note that this corresponds to a radiation in full-space rather than half-space. The Laplace transform of the sound pressure is $$P_d(s) = s^2 X(s) \frac{\rho_0 S_d}{4\pi d} = s^2 \left(\frac{X(s)}{U(s)}\right) U(s) \frac{\rho_0 S_d}{4\pi d} = \quad \text{(Eq. 66)}$$
$$\frac{1}{\phi} \frac{s(Z_3(s) + Z_6(s))}{Z_1(s) + Z_2(s) + Z_3(s) + Z_6(s)} U(s) \frac{\rho_0 S_d}{4\pi d},$$

and, $$|P_d(\omega)| = \frac{1}{\phi} \frac{\rho_0 S_d}{4\pi d} \left| \frac{j\omega(Z_3(j\omega) + Z_6(j\omega))}{Z_1(j\omega) + Z_2(j\omega) + Z_3(j\omega) + Z_6(j\omega)} U(j\omega) \right|, \quad \text{(Eq. 67)}$$

and the force factor $\phi$ can be estimated as the argument that minimizes the Mean Squared Error (MSE) between the predicted sound pressure, $|P_d(\omega)|$, and the measured sound pressure, $P_m(\omega)$:

$$\phi = \operatorname{argmin}\{E(\phi)\}, \quad \text{(Eq. 68)}$$

where $$E(\phi) = \qquad\text{(Eq. 69)}$$
$$\Sigma_\omega(P_m(\omega) - |P_d(\omega)|)^2 = \Sigma_\omega P_m(\omega)^2 + |P_d(\omega)|^2 - 2P_m(\omega)|P_d(\omega)|$$

$$= \Sigma_\omega P_m(\omega)^2 + \qquad\text{(Eq. 70)}$$
$$\frac{1}{\phi^2}\left(\frac{\rho_0 S_d}{4\pi d}\right)^2 \Sigma_\omega \left|\frac{j\omega(Z_3(j\omega) + Z_6(j\omega))}{Z_1(j\omega) + Z_2(j\omega) + Z_3(j\omega) + Z_6(j\omega)} U(j\omega)\right|^2 -$$
$$2\frac{1}{\phi}\frac{\rho_0 S_d}{4\pi d} \Sigma_\omega P_m(\omega)$$
$$\left|\frac{j\omega(Z_3(j\omega) + Z_6(j\omega))}{Z_1(j\omega) + Z_2(j\omega) + Z_3(j\omega) + Z_6(j\omega)} U(j\omega)\right|.$$

Hence, $$\frac{\partial E(\phi)}{\partial \phi} = -2\phi^{-3}\left(\frac{\rho_0 S_d}{4\pi d}\right)^2 \Sigma_\omega \qquad\text{(Eq. 71)}$$
$$\left|\frac{j\omega(Z_3(j\omega) + Z_6(j\omega))}{Z_1(j\omega) + Z_2(j\omega) + Z_3(j\omega) + Z_6(j\omega)} U(j\omega)\right|^2 +$$
$$2\phi^{-2}\frac{\rho_0 S_d}{4\pi d} \Sigma_\omega P_m(\omega)$$
$$\left|\frac{j\omega(Z_3(j\omega) + Z_6(j\omega))}{Z_1(j\omega) + Z_2(j\omega) + Z_3(j\omega) + Z_6(j\omega)} U(j\omega)\right| = 0 \Rightarrow$$

$$\phi = \frac{\rho_0 S_d}{4\pi d} \frac{\Sigma_\omega \left|\frac{j\omega(Z_3(j\omega) + Z_6(j\omega))}{Z_1(j\omega) + Z_2(j\omega) + Z_3(j\omega) + Z_6(j\omega)} U(j\omega)\right|^2}{\Sigma_\omega P_m(\omega)\left|\frac{j\omega(Z_3(j\omega) + Z_6(j\omega))}{Z_1(j\omega) + Z_2(j\omega) + Z_3(j\omega) + Z_6(j\omega)} U(j\omega)\right|}. \qquad\text{(Eq. 72)}$$

However, careful consideration should be given to the approximation of the acoustic radiation from a smartphone with the simple model of full-space radiation (i.e., from the diaphragm). Additionally, measurement of the sound pressure level with the built-in microphone cannot accurately be described as far field, and the transfer function of the acoustic design should be taken into consideration and possibly equalized in some embodiments. In embodiments, a near field measurement of the sound pressure for intermodulation distortion characterization may be used, in which case a near field sound pressure prediction would also be used. A near field sound pressure prediction is also consistent with the use of a device built-in microphone.

The described embodiments may be configured to use properties of only the measured magnitude impedance (i.e., from the sensed voice coil current and voltage signals) to fit the individual components of the impedance model. This results in a robust, accurate, and low complexity method that is insensitive to the phase of the current and voltage sense signals. That is, such a method uses only the magnitude of the current and voltage magnitude spectra to estimate the magnitude spectrum of the impedance. Additionally, this method converges quickly and is not subject to typical convergence issues of adaptive filters. The disclosed embodiments and processing to constrain diaphragm or cone displacement (i.e., excursions) is effectively a unique non-linear filter, that is highly effective in combination with a distortion suppression method to constrain the diaphragm displacement, minimize distortion to the signal, and yet maintain good loudness of the played-back audio signal.

Furthermore, the techniques and embodiments herein cover more than just the basic properties of the physical system made up of the loudspeaker—rather the described techniques and embodiments are capable of modeling unique features of device loudspeakers, such as microspeakers, mounted in devices. For instance, device loudspeakers may produce an impedance with two resonances (e.g., a primary resonance and a secondary resonance). The present techniques and embodiments are capable of modeling both the primary and the secondary resonance of such loudspeakers.

In embodiments, one or more of the operations of any flowchart described herein may not be performed. Moreover, operations in addition to or in lieu of any flowchart described herein may be performed. Further, in embodiments, one or more operations of any flowchart described herein may be performed out of order, in an alternate sequence, or partially (or completely) concurrently with each other or with other operations.

A "connector," as used herein, may refer to a hardware connection or a software connection for the transfer of data, instructions, and/or information, according to embodiments The further example embodiments and advantages described in this Section may be applicable to embodiments disclosed in any other Section of this disclosure.

Embodiments and techniques, including methods, described herein may be performed in various ways such as, but not limited to, being implemented in software, or software combined with hardware. For example, embodiments may be implemented in systems and devices, as well as specifically customized hardware, digital signal processors (DSPs), application specific integrated circuits (ASICs), electrical circuitry, and/or the like.

V. Example Computer Implementations

Loudspeaker protection system 100A of FIG. 1A, device 100B of FIG. 1B, microspeaker 100C of FIG. 1C, upstream loudspeaker model estimation component 200 of FIG. 2, impedance model fitter 400 of FIG. 4, impedance to excursion model converter 800 of FIG. 8, and/or downstream audio signal processing component 1400 of FIG. 14, along with any respective components/subcomponents thereof, and/or any flowcharts, further systems, sub-systems, and/or components disclosed herein may be implemented in hardware (e.g., hardware logic/electrical circuitry), or any combination of hardware with one or both of software (computer program code or instructions configured to be executed in one or more processors or processing devices) and firmware.

Figure 15:
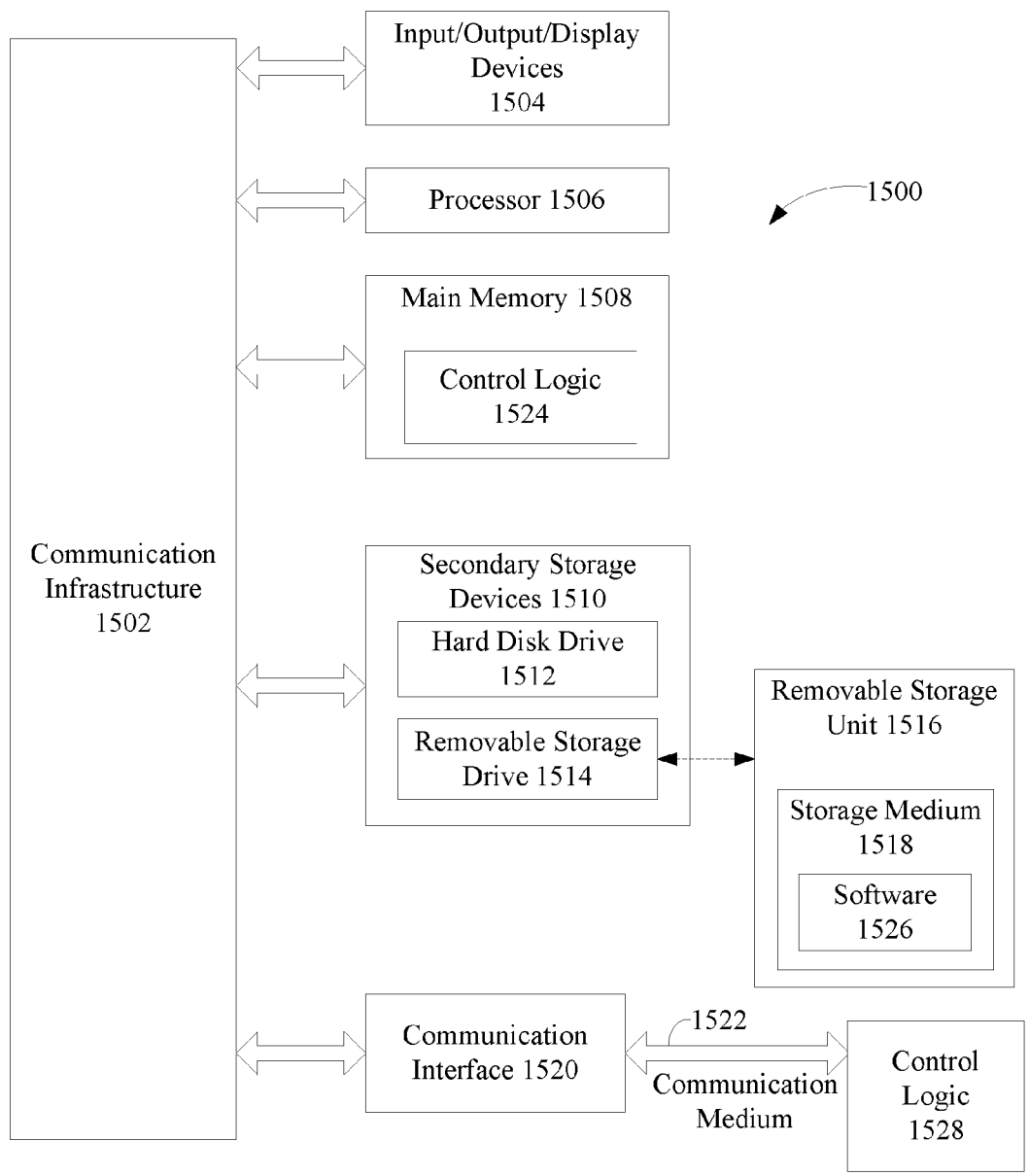
FIG. 15 shows a block diagram of a computing device/system in which the techniques disclosed herein may be performed and the example embodiments herein may be utilized.

The embodiments described herein, including circuitry, devices, systems, methods/processes, and/or apparatuses, may be implemented in or using well known processing devices, communication systems, servers, and/or, computers, such as a processing device 1500 shown in FIG. 15. It should be noted that processing device 1500 may represent communication devices/systems (e.g., device 100B), entertainment systems/devices, processing devices, and/or traditional computers in one or more embodiments. For example, loudspeaker protection systems and devices, and any of the sub-systems and/or components respectively contained therein and/or associated therewith, may be implemented in or using one or more processing devices 1500 and similar computing devices.

Processing device 1500 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 1500 may be any type of computer, including a desktop computer, a server, etc., and may be a computing device or system within another device or system.

Processing device 1500 includes one or more processors (also called central processing units, or CPUs), such as a processor 1506. Processor 1506 is connected to a communication infrastructure 1502, such as a communication bus. In some embodiments, processor 1506 can simultaneously operate multiple computing threads, and in some embodiments, processor 1506 may comprise one or more processors.

Processing device 1500 also includes a primary or main memory 1508, such as random access memory (RAM). Main memory 1508 has stored therein control logic 1524 (computer software), and data.

Processing device 1500 also includes one or more secondary storage devices 1510. Secondary storage devices 1510 include, for example, a hard disk drive 1512 and/or a removable storage device or drive 1514, as well as other types of storage devices, such as memory cards and memory sticks. For instance, processing device 1500 may include an industry standard interface, such a universal serial bus (USB) interface for interfacing with devices such as a memory stick. Removable storage drive 1514 represents a floppy disk drive, a magnetic tape drive, a compact disk drive, an optical storage device, tape backup, etc.

Removable storage drive 1514 interacts with a removable storage unit 1516. Removable storage unit 1516 includes a computer useable or readable storage medium 1518 having stored therein computer software 1526 (control logic) and/or data. Removable storage unit 1516 represents a floppy disk, magnetic tape, compact disk, DVD, optical storage disk, or any other computer data storage device. Removable storage drive 1514 reads from and/or writes to removable storage unit 1516 in a well-known manner.

Processing device 1500 also includes input/output/display devices 1504, such as touchscreens, LED and LCD displays, monitors, keyboards, pointing devices, etc.

Processing device 1500 further includes a communication or network interface 1520. Communication interface 1520 enables processing device 1500 to communicate with remote devices. For example, communication interface 1520 allows processing device 1500 to communicate over communication networks or mediums 1522 (representing a form of a computer useable or readable medium), such as LANs, WANs, the Internet, etc. Network interface 1520 may interface with remote sites or networks via wired or wireless connections.

Control logic 1528 may be transmitted to and from processing device 1500 via the communication medium 1522.

Any apparatus or manufacture comprising a computer useable or readable medium having control logic (software) stored therein is referred to herein as a computer program product or program storage device. This includes, but is not limited to, processing device 1500, main memory 1508, secondary storage devices 1510, and removable storage unit 1516. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media and propagating signals (do not include communication media and propagating signals). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of devices. For instance, embodiments may be included, without limitation, in processing devices (e.g., illustrated in FIG. 15) such as computers and servers, as well as communication systems such as switches, routers, gateways, and/or the like, communication devices such as smart phones, home electronics, gaming consoles, entertainment devices/systems, etc. A device, as defined herein, is a machine or manufacture as defined by 35 U.S.C. § 101. That is, as used herein, the term "device" refers to a machine or other tangible, manufactured object and excludes software and signals. Devices may include digital circuits, analog circuits, or a combination thereof. Devices may include one or more processor circuits (e.g., central processing units (CPUs), processor 1506 of FIG. 15), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

VI. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A loudspeaker protection system comprising:
    an upstream loudspeaker model estimation component that includes:
        an impedance model fitter configured to:
            receive voltage sense data and current sense data over a frequency range of a loudspeaker;
            estimate a plurality of impedance parameters associated with a plurality of impedance components of a model of the loudspeaker based on the voltage sense data and the current sense data; and
            fit, as a function of frequency, each of the plurality of impedance components to an estimated impedance based on the voltage sense data and the current sense data to generate an estimated impedance model of the loudspeaker by combining the plurality of fitted impedance components;
            wherein the plurality of impedance components include a voice coil resistivity component, a voice coil inductance component, a primary resonance component of the loudspeaker, and a secondary resonance component associated with an enclosure of the loudspeaker; and
        an excursion model converter configured to:
            receive the plurality of fitted impedance components that comprise the estimated impedance model from the impedance model fitter; and
            convert the estimated impedance model to an excursion model of the loudspeaker.

2. The loudspeaker protection system of claim 1, wherein the loudspeaker is a microspeaker.

3. The loudspeaker protection system of claim 1, wherein the impedance model fitter is further configured to:
    calculate lumped parameters for the primary resonance component of the loudspeaker and the secondary resonance component associated with the enclosure of the loudspeaker subsequent to the fitting of each of the plurality of impedance components, and
    generate the estimated impedance model using the lumped parameters.

4. The loudspeaker protection system of claim 1, wherein the excursion model comprises a continuous time transfer function.

5. The loudspeaker protection system of claim 1, wherein the excursion model is a discrete time transfer function that is transformed from a continuous time transfer function; and
    wherein the discrete time transfer function includes a plurality of excursion model parameters derived from the plurality of impedance parameters corresponding to the impedance components, or
    wherein the transformation from the continuous time transfer function to the discrete time transfer function is based on a bi-linear transformation.

6. The loudspeaker protection system of claim 5, wherein a parameter of the plurality of excursion model parameters of the excursion model corresponds to the secondary resonance component associated with the enclosure of the loudspeaker.

7. The loudspeaker protection system of claim 1, wherein at least one of:
    the impedance model fitter is configured to generate the estimated impedance model of the loudspeaker by combining less than all of the plurality of fitted impedance components; or
    the excursion model converter is configured to convert a portion of the estimated impedance model to an excursion model of the loudspeaker.

8. The loudspeaker protection system of claim 7, wherein the upstream loudspeaker model estimation component is configured to provide at least a portion of excursion model parameters of the excursion model to a downstream audio processing component configured to limit a predicted excursion of the loudspeaker based on the excursion model parameters and an audio signal, or
    wherein the upstream loudspeaker model estimation component is configured to provide the excursion model parameters asynchronously to the downstream audio processing component.

9. A method in a loudspeaker protection system, the method comprising:
    performing by an impedance model fitter:
        receiving voltage sense data and current sense data of a loudspeaker;
        estimating a plurality of impedance parameters associated with a plurality of impedance components of a model of the loudspeaker based on the voltage sense data and the current sense data;
        fitting each of the plurality of impedance components to impedance features of an estimated impedance based on the voltage sense data and the current sense data to generate an estimated impedance model of the loudspeaker by combining the plurality of fitted impedance components;
        wherein the plurality of impedance components include a voice coil resistivity component, a voice coil inductance component, a primary resonance component of the loudspeaker, and a secondary resonance component associated with an enclosure of the loudspeaker; and
    performing by an excursion model converter:
        receiving the plurality of fitted impedance components that comprise the estimated impedance model from the impedance model fitter; and
        converting the estimated impedance model to an excursion model of the loudspeaker.

10. The method of claim 9, wherein the loudspeaker is a microspeaker.

11. The method of claim 9, further comprising performing by the impedance model fitter:
    calculating lumped parameters for the primary resonance component of the loud speaker and the secondary resonance component associated with the enclosure of the loudspeaker subsequent to the fitting of each of the plurality of impedance components, and
    generating the estimated impedance model using the lumped parameters.

12. The method of claim 9, wherein the excursion model comprises a continuous time transfer function.

13. The method of claim 9, further comprising:
    transforming the continuous time transfer function to a discrete time transfer function to generate the excursion model; and wherein the discrete time transfer function includes a plurality of excursion model parameters derived from the plurality of impedance parameters corresponding to the plurality of impedance components, or wherein the transforming from the continuous time transfer function to the discrete time transfer function is performed based on a bi-linear transformation.

14. The method of claim 13, wherein a parameter of the plurality of excursion model parameters of the excursion model corresponds to the secondary resonance component associated with the enclosure of the loudspeaker.

15. The method of claim 9, further comprising:
providing excursion model parameters of the excursion model to a downstream audio processing component configured to limit a predicted excursion of the loudspeaker based on the excursion model parameters and an audio signal.

16. The method of claim 15, further comprising:
providing the excursion model parameters asynchronously to the downstream audio processing component at a rate that is less than or equal to a frame-rate of the downstream audio processing component.

17. A non-transitory computer readable storage device comprising a storage medium encoded with program instructions that, when executed by a computing device, cause the computing device to perform a method for loudspeaker protection based on processing of an audio signal, the program instructions comprising:
impedance model fitting program instructions for:
receiving voltage sense data and current sense data of a loudspeaker;
estimating a plurality of impedance parameters associated with a plurality of impedance components of a model of the loudspeaker based on the voltage sense data and the current sense data;
fitting each of the plurality of impedance components to impedance features of an estimated impedance based on the voltage sense data and the current sense data to generate an estimated impedance model of the loudspeaker by combining the plurality of fitted impedance components;
wherein the plurality of impedance components include a voice coil resistivity component, a voice coil inductance component, a primary resonance component of the loudspeaker, and a secondary resonance component associated with an enclosure of the loudspeaker; and
excursion model converter program instructions for:
receiving the plurality of fitted impedance components that comprise the estimated impedance model from the impedance model fitter; and
converting the estimated impedance model to an excursion model of the loudspeaker.

18. The loudspeaker protection system of claim 1, wherein the primary resonance component is associated with a first frequency resonance, and the secondary resonance component is associated with a second frequency resonance, wherein the second frequency resonance is higher in frequency than the first frequency resonance.

19. The method of claim 9, wherein the primary resonance component is associated with a first frequency resonance, and the secondary resonance component is associated with a second frequency resonance, wherein the second frequency resonance is higher in frequency than the first frequency resonance.

20. The non-transitory computer readable storage device of claim 17, wherein the primary resonance component is associated with a first frequency resonance, and the secondary resonance component is associated with a second frequency resonance, wherein the second frequency resonance is higher in frequency than the first frequency resonance.

* * * * *